United States Patent [19]
Dutta et al.

[11] Patent Number: 5,319,743
[45] Date of Patent: Jun. 7, 1994

[54] INTELLIGENT AND COMPACT BUCKETING METHOD FOR REGION QUERIES IN TWO-DIMENSIONAL SPACE

[75] Inventors: Shiraj R. Dutta, Shrewsbury; Ashutosh K. Roy, Waltham; Nagaraja R. Rao, Marlboro, all of Mass.

[73] Assignee: Digital Equipment Corporation, Maynard, Mass.

[21] Appl. No.: 862,467

[22] Filed: Apr. 2, 1992

[51] Int. Cl.$^5$ .............................. G06F 15/62
[52] U.S. Cl. ..................... 395/133; 395/141
[58] Field of Search ............... 395/133-139, 395/140, 141-143, 119, 120, 125; 364/444

[56] References Cited

U.S. PATENT DOCUMENTS 5,170,353 12/1992 Verstraete ........................... 364/444

OTHER PUBLICATIONS

Bently, "Multidimensional Binary Search Trees Used for Associate Searching", Communications of ACM, vol. 18, pp. 509-517, Sep. 1975; place of publication unknown.
Brown, "Multiple Storage Quad Trees: A Simpler Faster Alternative to Bi-Sector List Quad Trees", IEEE Transactions on CAD, vol. CAD-5, No. 3, pp. 419-419, Jul. 1986p place of publication unknown.
Fontayne & Bowman, "The Multiple Storage Radix Hash Tree: An Improved Region Query Data Structure", Digest of Technical Papers, ICCAD-87, pp. 302-305, undated; place of publication unknown.
Kadem, "The Quad-CIF Tree: A Data Structure for Hierarchical On-Line Algorithms", Proceedings of the 19th Design Automation Conference, pp. 352-357, Jun. 1982; place of publication unknown.
Li et al. "Two Layer Quad Trees: A Data Structure for High-Speed Interactive Layout Tools", Digest of Technical Papers, ICCAD-88, pp. 530-533, undated; place of publication unknown.
Ousterhout, "Corner Stitching: A Data-Structuring Technique for VLSI Layout Tools", IEEE Transactions on Computer-Aided Design, vol. CAD-3, No. 1, Jan. 1984, pp. 87-100; place of publication unknown.
Rosenberg, "Geographical Data Structures Compared: A Study of Data Structures Supporting Region Queries", IEEE Transactions on CAD, vol. CAD-4, No. 1, pp. 53-67, Jan. 1985; place of publication unknown.
Samet, "Hierarchical Representations of Collections of Small Rectangles", ACM Computing Surveys, vol. 20, No. 4, Dec. 1988; pp. 271-309, place of publication unknown.
Sherer et al., "Smals: A Novel Database for Two-Dimensional Object Location", IEEE Transactions on CAD, vol. 9 No. 1, pp. 57-65, Jan. 1990; place of publication unknown.

Primary Examiner—Heather R. Herndon
Assistant Examiner—Almis Jankus
Attorney, Agent, or Firm—Arnold, White & Durkee

[57] ABSTRACT

An improved graphical data structure and method for processing geometrical data stored in a two-dimensional area. The invention is especially suited to storing, deleting, and conducting queries of data related to two-dimensional objects, such as the elements of a VLSI chip layout. A two-dimensional area is provided for storing a plurality of two-dimensional objects. The area may be sub-divided into a horizontal plane and a vertical plane, wherein each plane may contain one or more surfaces. Each surface typically contains a plurality of stripes of equal horizontal dimension, and the stripes are each sub-divided into sub-stripes. An object whose minimum bounding box intersects a particular sub-stripe is represented in one of four bucket lists associated with that sub-stripe. In one example of a preferred embodiment, the bucket list is selected depending upon whether the portion of the object that intersects the sub-stripe is the object's lower-left corner, left edge, bottom edge, or another portion of the object. Each bucket list is made up of a bucket list head and a number of buckets. Routines are provided for inserting objects into the graphical data structure, deleting objects from the structure, and conducting regional queries of the structure.

27 Claims, 6 Drawing Sheets

INTELLIGENT AND COMPACT BUCKETING METHOD FOR REGION QUERIES IN TWO-DIMENSIONAL SPACE

BACKGROUND OF INVENTION

1. Field of Invention

The present invention pertains broadly to a system for recording or storing the positions of a plurality of objects arranged in an essentially two-dimensional array or plat. The invention more especially pertains to an improved system for generating graphical displays of typically rectangular objects arranged on an essentially two-dimensional surface. The invention has particular application to a graphical system for storing, displaying and manipulating the positions of substantially two-dimensional objects such as the elements of integrated circuits, printed circuit boards, and the like.

2. Description of Related Art

One of the first steps in manufacturing a circuit such as an integrated circuit or printed circuit board involves positioning, or "laying out", the various elements of the circuit and their interconnections. Typically, these circuit elements include transistors, resistors, capacitors, wires, and the like.

Various computer-based systems, called "graphical data structures", have been used to lay out these types of circuits. These graphical data structures typically include routines capable of storing the circuit elements in computer memory, adding new elements, deleting or re-arranging existing elements, and conducting regional queries of elements. When the circuit elements have been finally laid out, information regarding their positioning is output from the computer memory and used to create one or more sheets or "tapes," which provide a blueprint-like representation of the circuit. Later, the tapes may be used in the process of etching, depositing, or otherwise constructing the integrated circuit on a silicon substrate, such processes being well known in the art of semiconductor manufacturing.

The function of graphical data structures is not limited to manipulating circuit elements; in fact, graphical data structures are generally useful in manipulating other two-dimensional shapes. The two-dimensional shapes stored in a graphical data structure are called "objects".

Graphical data structures come in a variety of forms. One known graphical data structure is the multi-dimensional binary tree, often called the "k-d tree". With k-d trees, the size of an object is considered to be the size of the smallest rectangle ("bounding rectangle") capable of containing the object. Objects are sorted according to the horizontal and vertical ("x-y") positions of the left, right, top, and bottom sides of their bounding rectangle.

FIG. 1A shows several objects to be stored in a k-d tree and FIG. 1B illustrates the structure of the k-d tree after the objects are stored therein. Generally, objects to be stored in a k-d tree are sorted according to the position of their edges. In successive sorting operations, the edges are sorted in an order such as the following: left edge, bottom edge, right edge, and top edge.

In the example of FIGS. 1A and 1B, seven objects are to be stored in the k-d tree. Sorting the objects of FIG. 1A according to their left edges places objects 51, 52, and 56 to the left of the left edge of object 53, and objects 54, 55, and 57 to the right of the left edge of object 53. Object 53 is chosen as a central reference point, or "node" of the rectangles, since half of the objects' left edges are to the left of the left edge of object 53 and half of the objects' left edges are to the right of the left edge of object 53.

After the objects are divided in this manner, they are sorted according to the position of their bottom edges. For instance, object 51 forms a node since the bottom edge of object 51 is between the bottom edges of objects 52 and 56. Similarly, object 54 forms a node since the bottom edge of object 54 is between the bottom edges of objects 57 and 55. If additional objects were present in the structure, the objects would be sorted by their right, and then their top edges. This process would be repeated until each node contains a single object.

By using this method, time is saved since a particular region can be queried without searching through all data in the k-d tree. In the above example, a query of the left region would yield objects 53, 51, 52, and 56.

Although k-d trees have been useful for some purposes, they suffer from a number of disadvantages. In the above example, the right region would become more densely populated than the left region if several objects having bounding rectangles with left-edge positions to the right of object 53 were inserted. In this condition, the k-d tree is "unbalanced", and queries of the k-d tree are inefficient. As a result, when the right region is queried, the query must search through more than half of all objects in the k-d tree. In the extreme case, when all objects in the left region are deleted, the k-d tree degenerates into a simple linked list (described below), and queries of the right region must search through all objects in the k-d tree.

An unbalanced k-d tree is inefficient since it requires excessive time to conduct queries. One approach that has been used to overcome balancing problems is periodically re-balancing the k-d tree. Re-balancing involves selecting a new node to re-define the left and right regions. Thus, after re-balancing, each region contains about half of the total number of objects, with the node dividing the two regions.

Although some of the problems with k-d trees are reduced by re-balancing, k-d trees are still limited since they require more computer memory than might be desired for some purposes. Some tolerate this limitation, since k-d trees can offer high query speed in some applications.

Another known graphical data structure is the "quad tree". This category includes a group of programs that have certain common characteristics. With quad trees, a horizontal line and a vertical line divide a two-dimensional area into four quadrants. Objects are categorized according to whether they lie entirely within one of the quadrants, intersect the vertical line, or intersect the horizontal line. For greater detail, each quadrant can be divided into sub-quadrants.

Like other graphical data structures of this type, the object of a query is to identify objects lying within a specified query region. One disadvantage of querying using quad trees is that the queries often yield duplicate results. Since it is possible for an object spanning the query region to intersect the horizontal and/or vertical lines, every query must search through all objects intersecting the vertical and/or horizontal lines.

One modification used to overcome this disadvantage has been to abandon the categories based on horizontal and vertical line intersection. Thus, an object is categorized solely upon the quadrant or sub-quadrant that the object lies in. However, if an object spans two or more quadrants, a query including those quadrants would encounter the object two or more times, i.e. once in each quadrant.

One solution to duplicate reporting in quad trees has been to maintain a software flag for each object. After the object has been reported during a query, a flag associated with that object is set. When an object's flag is set during a query, that object cannot be reported for the remainder of the query. As a result, objects are never reported more than once.

Although this solution has been helpful in some applications, it is limited in that it requires additional computer memory to operate. Furthermore, this solution is limited since it slows the query process by requiring additional operations, such as re-setting the flags. Generally, quad trees are not as memory-intensive as k-d trees. Nonetheless, quad trees require more memory than might be desired in some applications.

Another popular graphical data structure is the linked list. A typical linked list involves a list of data records, wherein each record contains an object and a pointer that points to the beginning of the next record. Although linked lists are useful for some purposes, they are not as efficient as k-d trees or quad trees. As a result, linked lists might be unsatisfactory for certain applications, since linked lists require additional time to conduct queries, additions, and deletions.

One common disadvantage of the k-d trees, quad trees, and linked lists is that they tend to be inefficient when the graphical data include objects having diverse ratios of vertical dimension to horizontal dimension ("aspect ratios"). Quad trees, k-d trees, and linked lists may be satisfactory in some applications involving small objects; however, k-d trees, quad trees, and linked lists perform poorly when applied to the graphical handling of objects of various sizes, e.g., small objects, long narrow objects, medium-sized objects, and very large objects. This type of application is representative of a typical VLSI (very large scale integrated) chip layout. Thus, k-d trees, quad trees, and linked lists perform poorly when the graphical data comprises a VLSI chip layout.

BRIEF SUMMARY OF INVENTION

The present invention addresses the unique problems described above with a system that, in a general aspect, uses unique surfaces to graphically represent an assembly of two-dimensional objects contained in a flat area. The graphical representations of the objects are preferably rectangular, and of a size to enclose their respective objects. Thus, a long, narrow object will be graphically represented by a long, narrow rectangle.

A representative surface of the invention preferably defines a grid of parallel, evenly spaced stripes, extending horizontally across the surface. The stripes are preferably subdivided into sub-stripes by a set of vertical lines that are horizontally and evenly spaced.

The representative surface described above may be referred to as a "horizontal" surface, since the stripes extend horizontally. This type of surface is graphically preferred for objects that are horizontally disposed, i.e., objects that are larger in the horizontal dimension than in the vertical dimension. If the objects in any given application include objects that are disposed at an angle to the horizontal, a second surface may be employed in which the stripes extend across the second surface at the appropriate angle. As an example, a second surface having vertically disposed stripes and sub-stripes may be employed for graphically modeling objects that are vertically disposed.

The size of the sub-stripes on any given surface may be selected as explained in more detail later in this description. In general, the sub-stripes should be small enough to accommodate the smallest objects represented on the surface, but not so small as to require undue amounts of computer memory. In applications having objects that vary considerably in size, it is preferred to use multiple surfaces where the stripes of each surface differ in height from the other surfaces. The stripes on each surface, however, are preferably of equal height. Accordingly, each surface is directed at representing objects of a different range of sizes.

It will be recognized that objects such as the elements of an integrated circuit or of a printed circuit board are essentially two-dimensional but not always rectangular. For the purposes of the present invention, however, all such elements are preferably represented graphically by rectangles which enclose or bound their respective elements. Thus, each element will be represented by a rectangular, "minimum bounding box" that is sized to circumscribe the element.

The graphical position of an object's minimum bounding box on a surface is defined by the sub-stripes on that surface that are intersected by two pre-determined edges of the object's minimum bounding box.

Assuming use of the bottom and left edges of the minimum bounding boxes, each sub-stripe is assigned four "bucket lists" to identify the positions of the objects corresponding to the minimum bounding boxes that intersect that sub-stripe. A first such bucket list includes all minimum bounding boxes whose bottom and left edges intersect the sub-stripe associated with that bucket list; a second bucket list includes all minimum bounding boxes having only a left edge intersecting the sub-stripe; a third bucket list includes all minimum bounding boxes having only a bottom edge intersecting the sub-stripe; a fourth bucket list includes all minimum bounding boxes that intersect the sub-stripe but whose bottom and left edges do not intersect the sub-stripe. By ascertaining which bucket list or lists identify any given object, the position of the object is fixed and thereby known. Each bucket list is preferably provided with one or more buckets for storage of data pertaining to the positions of the objects on that list.

The above system is preferably implemented by the use of suitable computer and data storage facilities. As will be described later in this specification, a given surface having multiple objects (viz., a circuit board with numerous circuit elements) may be graphically represented or modeled by the objects' minimum bounding boxes. Thus, the size and position of each such object is graphically represented by its own particular minimum bounding box. Further, the invention enables individual boxes to be moved around, added, deleted or otherwise manipulated as the objects to which they correspond are similarly manipulated. Additionally, the invention facilitates queries of user-specified regions of the surfaces to effectively identify the minimum bounding boxes corresponding to the query region. Unlike known data structures, the present invention operates with especially improved speed and memory efficiency when the two-dimensional objects comprise objects of diverse sizes and shapes, such as the objects in a typical VLSI chip layout.

DESCRIPTION OF DRAWINGS

The exact nature of the invention, as well as other objects and advantages thereof, will become more apparent to those skilled in the art after consideration of the following detailed description in connection with the accompanying drawings, in which like reference numerals designate like parts throughout, wherein.

DESCRIPTION OF A PREFERRED EMBODIMENT

Figure 1A:
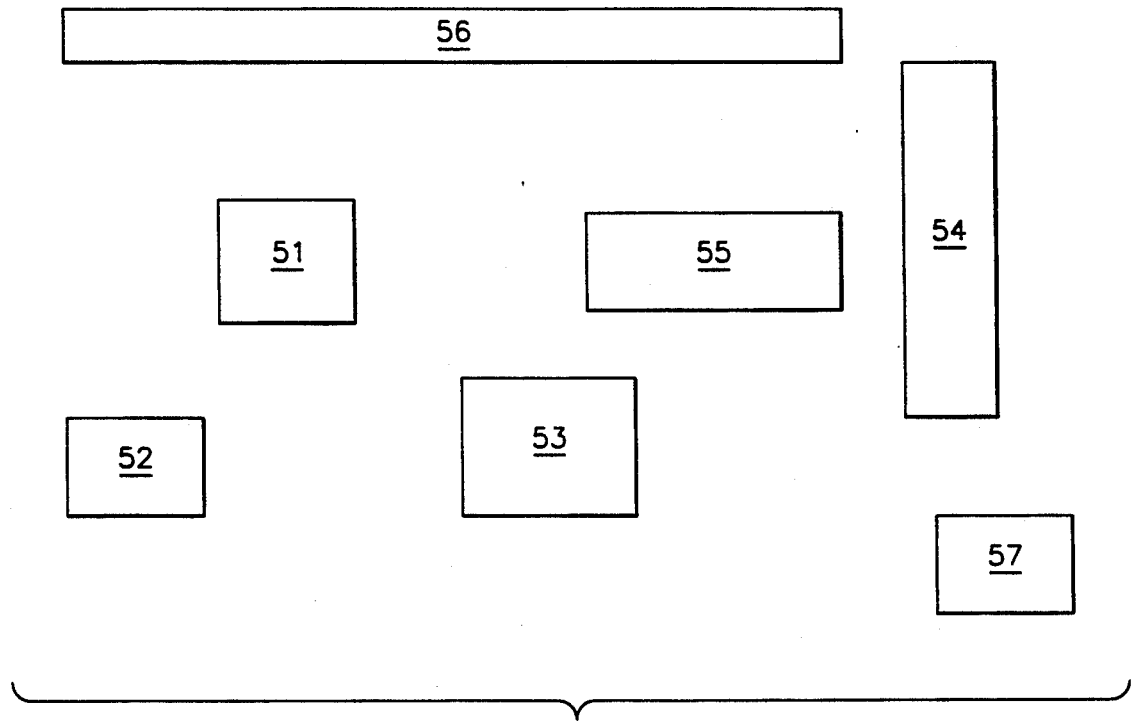
FIG. 1A is a diagram illustrating a number of objects to be placed in a k-d tree.
Figure 1B:
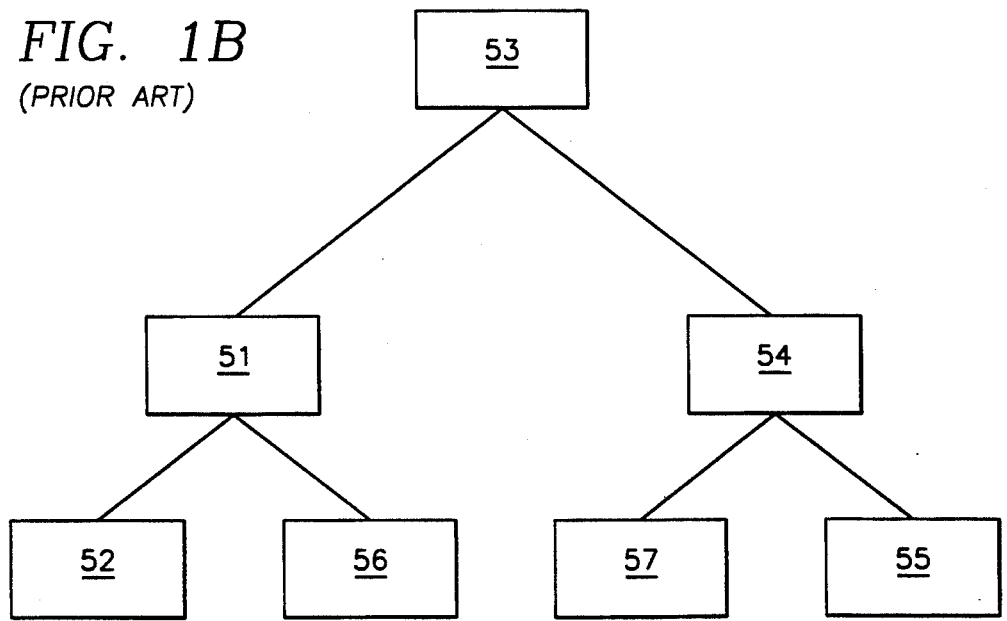
FIG. 1B is a diagram illustrating a k-d tree arrangement for the objects of FIG. 1A.
Figure 1C:
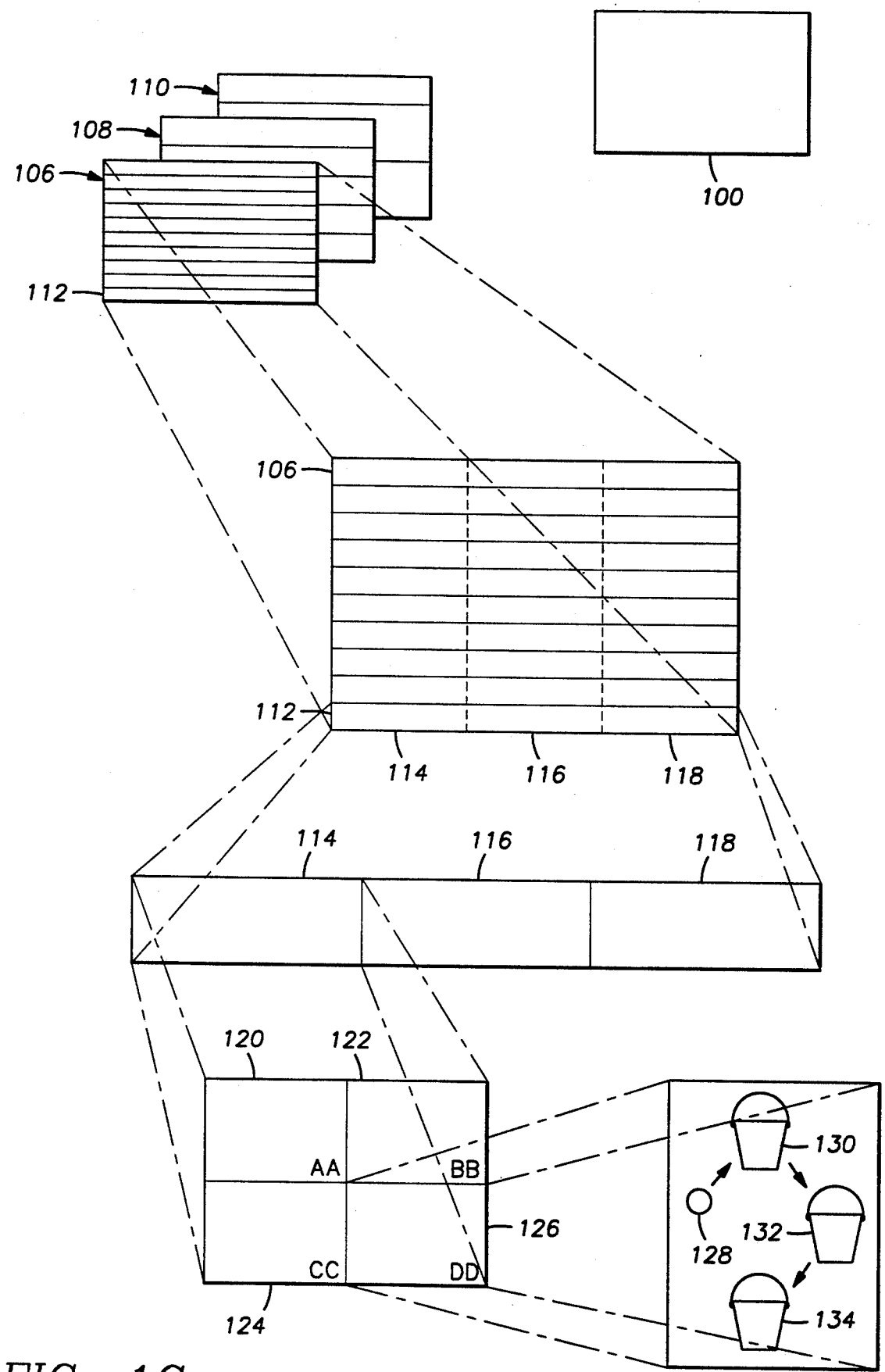
FIG. 1C is a diagram illustrating a flat area 100 and two-dimensional surfaces 106, 108, and 110 of the present invention.

Referring to FIG. 1C, a plurality of two-dimensional objects (not shown) are stored in a flat area 100. The objects comprise elements of a VLSI chip layout, printed circuit board elements, or other two-dimensional objects. Typically, the area 100 might comprise a computer display, computer memory, or other location that can be considered to be a two-dimensional region. To facilitate more efficient storage, insertion, deletion, and manipulation of the objects in the area 100, the objects are represented in a graphical data structure in accordance with the present invention. In a preferred embodiment, the graphical data structure includes a first surface 106, a second surface 108, and a third surface 110. Each of the surfaces 106, 108, and 110 corresponds to the area 100, and each surface represents objects having certain sizes, as described below.

Each of the surfaces 106, 108, and 110 includes a plurality of parallel stripes. For example, a stripe 112 is shown on the surface 106. All stripes on the same surface have the same vertical dimension. The surfaces 106, 108, and 110 have stripes with successively increasing vertical dimensions.

Each stripe is further sub-divided into one or more sub-stripes, arranged longitudinally with respect to each other, as illustrated by sub-stripes 114, 116, and 118 of the stripe 112. The height of the smallest sub-stripes, i.e. those on the surface with the stripes of the least vertical dimension, is selected to optimize the memory required by the sub-stripes and the speed of operations such as insert, delete, and query operations of the invention. Since a VLSI chip layout might contain tens of millions of objects, optimizing the speed of these operations is critical to the efficient operation of the invention.

To reduce the memory required by the sub-stripes themselves, it is desirable to minimize the total number of sub-stripes. However, with a small total number of sub-stripes, each sub-stripe must be larger to cover a given area. Accordingly, when larger sub-stripes are used, it is unduly time consuming to conduct small queries. This occurs since, although several of these larger sub-stripes might intersect the small query region, most of the many objects in those larger sub-stripes will not intersect the small query region. As a result, the query must search through many objects that do not intersect the query region, and the region query is retarded. Therefore, the memory requirements of the sub-stripes themselves and the number of objects contained in the sub-stripes are balanced to determine the size of the smallest sub-stripes. It is also important to consider the expected average size of a region query, since queries of small regions will require smaller sub-stripes.

This balance is explained quantitatively via the following calculations, wherein:

x = horizontal dimension of the area 100
y = vertical dimension of the area 100
m = total number of objects in the area 100
k = average acceptable number of objects in a sub-stripe
h = vertical dimension of smallest sub-stripe
w = horizontal dimension of smallest sub-stripe
r = aspect ratio of a sub-stripe = w/h
s = total number of sub-stripes in the surface 106

As shown in equation 1.1, the value of s is calculated as the total area of the area 100 divided by the dimensions of a single sub-stripe.

$$s = 2 \cdot (x \cdot y)/(w \cdot h) \tag{1.1}$$

Substituting m/k for s, equation 1.2 is obtained.

$$m = 2 \cdot (x \cdot y)/(w \cdot h) \cdot k \tag{1.2}$$

Substituting r·h for w, equation 1.3 is obtained.

$$m = 2 \cdot (x \cdot y)/(r \cdot h^2) \cdot k \tag{1.3}$$

Solving equation 1.3 for h yields equation 1.4.

$$h^2 = (2 \cdot x \cdot y \cdot k)/(r \cdot m), \tag{1.4}$$

The vertical dimension of the smallest sub-stripe is thus shown in equation 1.5.

$$h = [(2 \cdot x \cdot y \cdot k)/(r \cdot m)]^{\frac{1}{2}}. \tag{1.5}$$

The vertical dimension of each sub-stripe on the surface 108 is determined by multiplying the vertical dimension of the sub-stripes of the surface 106 by $R_1$, a hierarchy ratio. Similarly, the vertical dimension of each sub-stripe on the surface 110 is determined by multiplying the vertical dimension of the sub-stripes of the surface 108 by $R_1$. The hierarchy ratio $R_1$ is selected to best accommodate all types of data present in the area 100, i.e. the small rectangular objects, medium-sized objects, and very large objects. Also, to best accommodate all types of data present in the area 100, the present invention automatically increases the number of surfaces in the area 100 when needed. However, the invention limits the number of surfaces to be utilized to a number received by a "computer operator". It is understood that the present invention may be used by a graphical editor that is controlled by a human computer operator or an application program. Therefore, when the words "computer operator" are used, they are not necessarily limited to a human operator.

The horizontal dimension of the smallest sub-stripes is determined simply by multiplying the vertical dimension of the smallest sub-stripe by the desired aspect ratio, i.e. by calculating r·h. The aspect ratio is selected to best accommodate the aspect ratios of the smallest objects expected to be present in the area 100. For instance, if most of the smallest objects in the area 100 are expected to have large horizontal dimensions and small vertical dimensions, it will be more efficient if the smallest sub-stripe has a large aspect ratio. On the other hand, if most of the smallest objects in the area 100 are expected to be square objects, it will be more efficient if the smallest sub-stripe has an aspect ratio closer to 1. Many applications, however, will contain objects with a mix of aspect ratios. In these cases, the aspect ratio for the smallest sub-stripe is selected by balancing the requirements of the various objects expected to be in the area 100.

The horizontal dimension of the next-larger sub-stripes, i.e. those of the surface 108, is equal to the horizontal dimension of the sub-stripes of the surface 106 multiplied by $R_2$, a hierarchy ratio. Similarly, the horizontal dimension of the stripes of the surface 110 is equal to the horizontal dimension of the stripes of the surface 108 multiplied by $R_2$.

Objects that intersect a sub-stripe are represented in one of four "bucket lists" associated with that sub-stripe. For example, objects that intersect the sub-stripe 114 are listed on an "AA" bucket list 120, "BB" bucket list 122, "CC" bucket list 124, or "DD" bucket list 126.

Each bucket list is made up of a bucket list head and one or more buckets. For example, the AA bucket list 120 comprises a bucket list head 128, a first bucket 130, a second bucket 132, and a third bucket 134. Together, the buckets can be thought of as a linked list, wherein each link (i.e. a bucket) contains a number of objects. The number of objects contained in a single bucket cannot exceed a pre-determined bucket size, discussed below. The bucket list head 128 points to the first bucket 130, the first bucket 130 points to the second bucket 132, and so on. When all buckets in a bucket list are full, the system automatically adds another bucket, and provides the final existing bucket with a pointer directed to the added bucket.

To determine the optimal pre-determined bucket size, the following calculations are made, using the following variables:

b=capacity, in number of objects, of one bucket
P=average number of objects stored per bucket-list (known)
M=total memory per bucket-list (known)
A=average memory overhead per bucket (known)
b/2=amount of unused memory Assuming one integer in memory is occupied for each object, the memory required by a bucket list is the sum of the following: (1) the number of objects stored in the entire bucket list, i.e. P; (2) the amount of memory overhead for the entire bucket list, i.e. A·P/b; (3) and the amount of memory associated with empty bucket spaces, i.e. b/2. In some cases, all buckets in a bucket list will be full, and there will be no unused memory in that bucket list; however, in other cases, the last bucket of the bucket list will only contain a single object, so that the remaining memory of that bucket is unused. Therefore, the average amount of unused memory in the last bucket is about on the average b/2. The memory required by a bucket list is therefore calculated as shown in equation 2.1:

$$M = P(1 + A/b) + b/2 \quad (2.1)$$

To determine the optimal value of b, equation 2.1 is differentiated with respect to b and solved, as shown in equations 2.2 through 2.4:

$$dM/db = P(-A/b^2) + \tfrac{1}{2} = 0 \quad (2.2)$$

$$P \cdot A(b^2) = \tfrac{1}{2} \quad (2.3)$$

$$b = (2PA)^{\tfrac{1}{2}} \quad (2.4)$$

Thus, the optimal pre-determined bucket size is $(2PA)^{\tfrac{1}{2}}$.

OTHER EMBODIMENTS

Figure 1D:
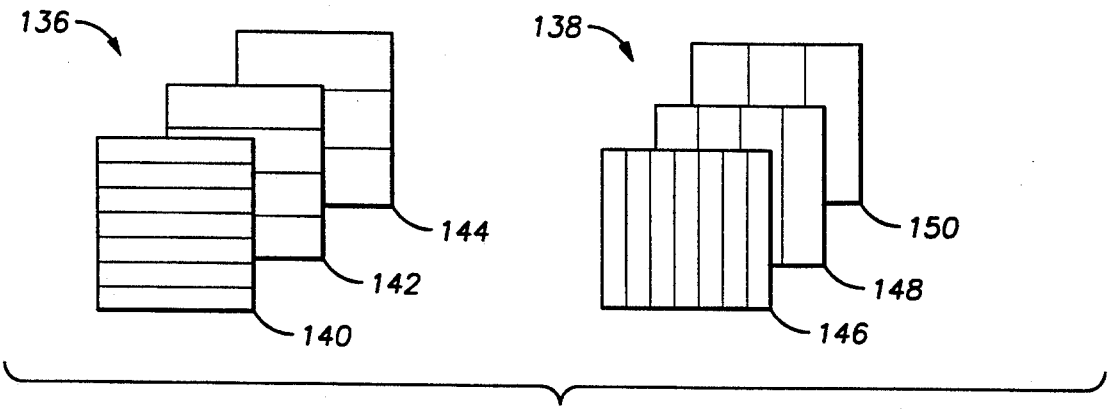
FIG. 1D is a diagram illustrating a second embodiment of the present invention.

In another preferred embodiment of the invention, shown in FIG. 1D, the graphical data structure includes a horizontal plane 136 and a vertical plane 138. The horizontal plane 136 includes a first horizontal surface 140, a second horizontal surface 142, and a third horizontal surface 144. Likewise, the vertical plane 138 includes a first vertical surface 146, a second vertical surface 148, and a third vertical surface 150.

Within each of the planes 136, 138, the surfaces are arranged and sub-divided in the same manner as the surfaces 106, 108, and 110, described in detail above. For example, the surfaces of each plane are sub-divided into stripes and sub-stripes (not shown), with each sub-stripe being associated with four bucket lists (not shown). However, as shown in FIG. 1D, the stripes of the vertical plane 138 are oriented in the vertical direction, and the stripes of the horizontal plane 136 are oriented in the horizontal direction. The number of surfaces, size of stripes, size of sub-stripes, and size of bucket lists of the vertical plane 138 is determined in the same manner as these parameters were determined in conjunction with the surfaces 106, 108, 110, as described in detail above.

As described in greater detail below, the purpose of the vertical plane 138 is to more efficiently accommodate objects that are oriented in the direction of the stripes of the vertical plane 138. These types of objects have low aspect ratios, i.e. large vertical dimensions and small horizontal dimensions. Objects having high aspect ratios are stored in the horizontal plane 136.

If an object having a low aspect ratio were to be stored in the horizontal plane 136, it would span several sub-stripes, since each sub-stripe of the horizontal plane 136 has a small vertical dimension. Accordingly, an excessive amount of memory would be necessary to store the object, since a representation of the object would be stored in a bucket list of each sub-stripe. However, by storing the low-aspect-ratio object in the vertical plane 138, a lesser number of sub-stripes are spanned since these sub-stripes have a greater vertical dimension. As a result, less memory is required to store the object in the vertical plane 138.

In still another preferred embodiment of the invention, the two-dimensional area 100 described above is further sub-divided to include a 45° plane (not shown). Like the horizontal and vertical planes, the 45° plane contains one or more surfaces, each sub-divided into stripes and sub-stripes, with each sub-stripe being associated with four bucket lists (not shown). However, the stripes of the 45° plane are oriented at a 45° degree angle with respect to the stripes in the horizontal plane. The number of surfaces, size of stripes, size of sub-stripes, and size of bucket lists of the 45° plane are determined in the same manner as these parameters were determined in conjunction with the surfaces 106, 108, 110, as described in detail above.

The purpose of the 45° plane is to more efficiently accommodate objects oriented in the direction of the stripes of the 45° plane. However, the invention is contemplated to include any planes of any orientation and number, not necessarily including horizontal or vertical planes, so that the invention can most efficiently accommodate any desired array of objects.

OPERATION OF THE INVENTION

Having described the structure of the invention, the overall operation of the invention will now be described. The present invention is implemented by installing a computer program in a computer. In the preferred embodiment, a VAX 3100 spx TM model computer is used; however, it is understood that the present invention can be implemented in a wide variety of computers. The computer program of the invention includes a number of C-language programming lines, which are the subject of copyright, and are shown in order of execution in an Appendix, which is attached and incorporated herein.

Insert Routine

Figure 2:
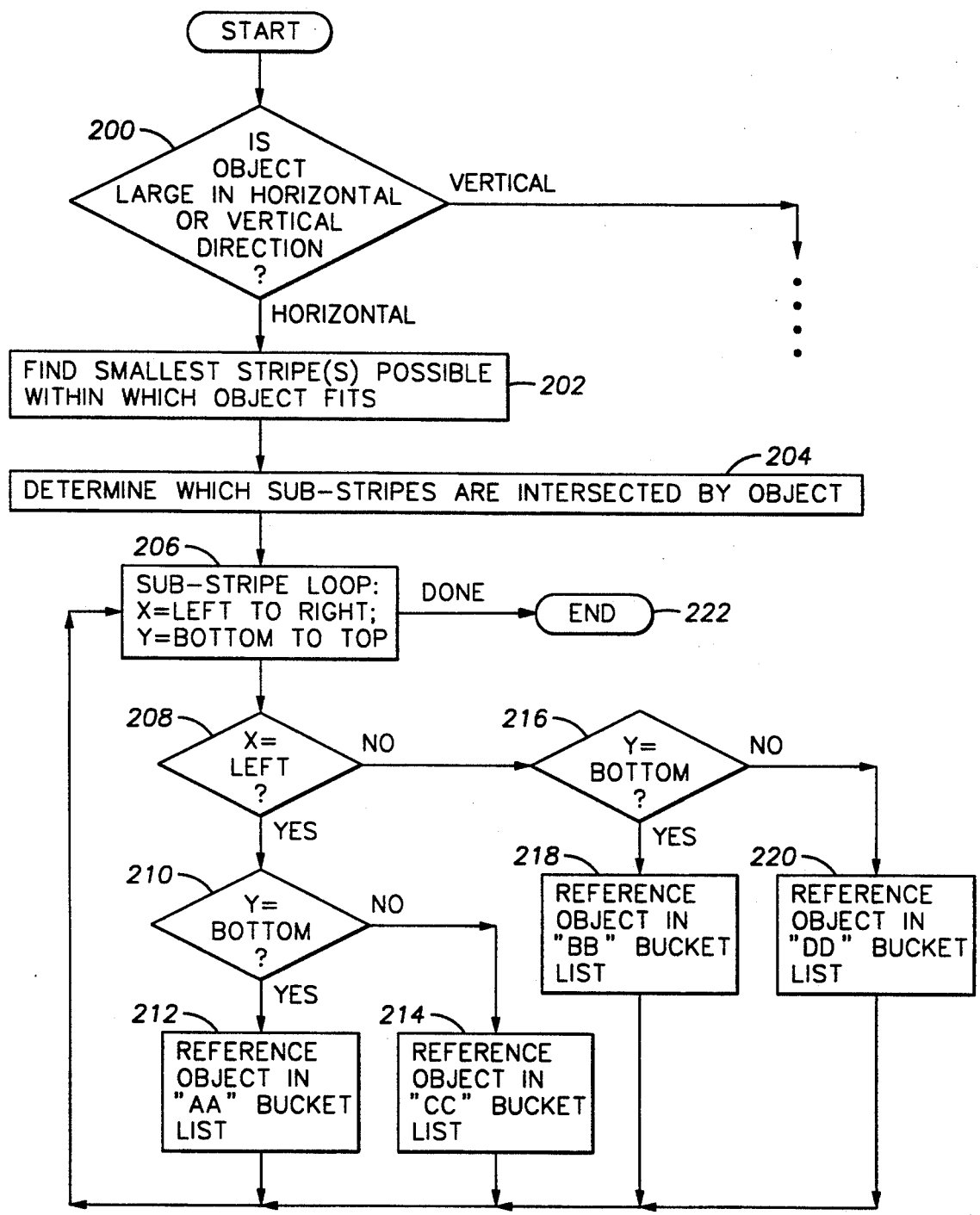
FIG. 2 is a flowchart illustrating the operation of an insert routine of the present invention.

Referring to FIG. 2, an insert routine will be described. Each object to be stored in the graphical data structure of the present invention is processed according to the smallest rectangle capable of containing the object. This rectangle is called the object's "minimum bounding box", and is by definition normal to the horizontal and vertical directions.

Each object to be inserted into the graphical data structure of the present invention is placed into one of two groups, one group corresponding to the horizontal plane 136, and the other group corresponding to the vertical plane 136. In particular, an object having a minimum bounding box that is larger in the horizontal direction is classified as a "horizontal object" and stored in the horizontal plane 136. Similarly, an object having a minimum bounding box that is larger in the vertical direction is classified as a "vertical object" and stored in the vertical plane 138. An object with a square minimum bounding box is stored in the horizontal plane 136.

Branch 200 asks whether the object to be stored is a "horizontal object" or a "vertical object". For ease of understanding, the description herein will be limited to the horizontal plane, since the operation of the vertical plane is analogous to that of the horizontal plane.

Each object to be stored in the horizontal plane 136 is classified, based on the size of the object's minimum bounding box, as lying within one surface, one or more stripes of that surface, and one or more sub-stripes of those stripes. Step 202 effectively determines the proper surface in which the object should be classified. An object should be classified in the surface with the stripes having the smallest possible vertical dimension, so that the object's minimum bounding box spans two or less stripes. Thus, very small minimum bounding boxes might lie completely within a single stripe of a surface with stripes of small vertical dimension. Larger minimum bounding boxes might lie in two adjacent stripes. However, if an minimum bounding box's vertical dimension is greater than twice the vertical dimension of the stripes with the largest vertical dimension, the minimum bounding box will lie in the surface having those stripes, in as many stripes as are necessary to contain the object.

Thus, the system functions to sift smaller objects into one or more stripes of shorter vertical dimension, leaving the taller objects in one or more stripes of larger vertical dimension.

After the minimum bounding box's position within one or more stripes is determined, step 204 determines which sub-stripes are intersected by the minimum bounding box. Then, step 206 starts a loop that sequentially traverses through all sub-stripes intersecting the object. For each sub-stripe, the loop stores a representation of the object in one of the four bucket lists associated with that sub-stripe.

When branches 208 and 210 determine that the current sub-stripe intersects the bottom and left edges of the object's minimum bounding box, step 212 stores a representation of the object in the AA bucket list of the current sub-stripe. Then, the loop is advanced in step 206.

When branches 208 and 210 determine that the current sub-stripe intersects only the left edge of the object's minimum bounding box, step 214 stores a representation of the object in the CC bucket list associated with the current sub-stripe. Then, the loop is advanced in step 206.

When branches 208 and 216 determine that the current sub-stripe intersects only the bottom edge of the object's minimum bounding box, step 218 stores a representation of the object in the BB bucket list associated with the current sub-stripe. Then, the loop is advanced in step 206.

However, if branch 216 determines that the current sub-stripe intersects neither the bottom nor the left edge of the object's minimum bounding box, step 220 stores a representation of the object in the DD bucket list associated with the current sub-stripe. Then, the loop is advanced in step 206. After all sub-stripes intersecting the object have been processed as described above, the insert routine ends in step 222.

Figure 3:
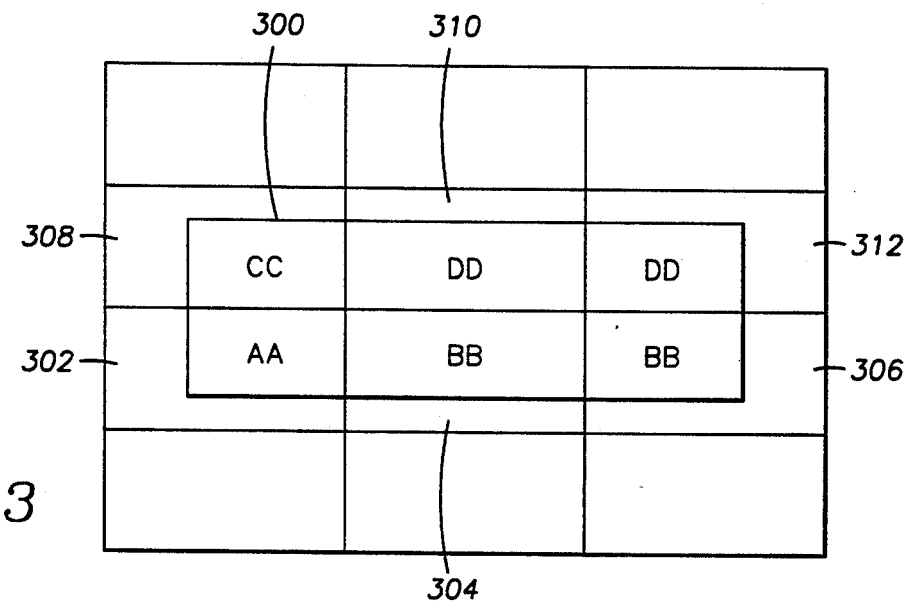
FIG. 3 is a diagram illustrating the intersection of an object's minimum bounding box 300 with various sub-stripes, and also showing the bucket lists in which a representation of the object is stored.

Referring to FIG. 3, the intersection of a minimum bounding box 300 with sub-stripes 302, 304, 306, 308, 310, and 312 is shown. In the area defined by the sub-stripe 302, the representation of the object 300 is stored in bucket list AA since both left and bottom edges of the minimum bounding box are intersected.

In the sub-stripes 304 and 306, the representation of the object 300 is stored in bucket list BB of each sub-stripe since only the bottom edge of the minimum bounding box is intersected. In the area defined by the sub-stripe 308, the representation of the object 300 is stored in bucket list CC of that sub-stripe since only the left edge of the minimum bounding box is intersected. In the sub-stripes 310 and 312, the representation of the object 300 is stored in bucket list DD of each sub-stripe since neither the left nor the bottom edge of the minimum bounding box is intersected.

Delete Routine

Figure 4:
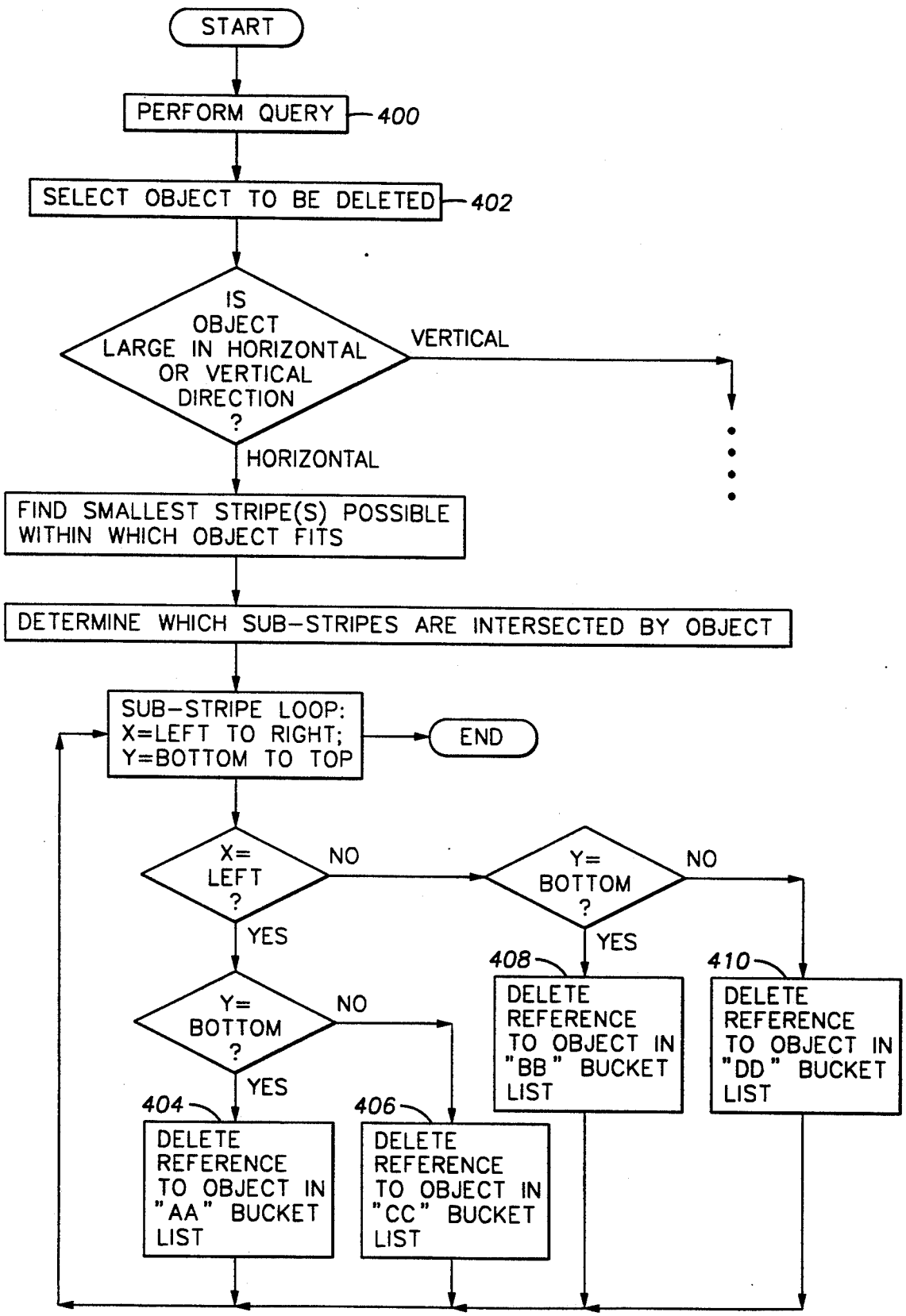
FIG. 4 is a flowchart illustrating the operation of a delete routine of the present invention.

The delete routine of FIG. 4 operates analogously to the insert routine of FIG. 2. In step 400, the computer operator performs a query (described below) of a particular region, to identify all objects that intersect the region. In step 402, the computer operator selects the object to be deleted from the objects identified in the query.

Then, the remaining steps and queries of the delete routine operate in the same manner as identical steps in the insert routine. These steps effectively determine the surface, stripes, sub-stripes and bucket lists in which representations of the object's minimum bounding box are stored. Then, steps 404, 406, 408, and/or 410 delete the bucket lists' references to the object.

Query Routine

Figure 6:
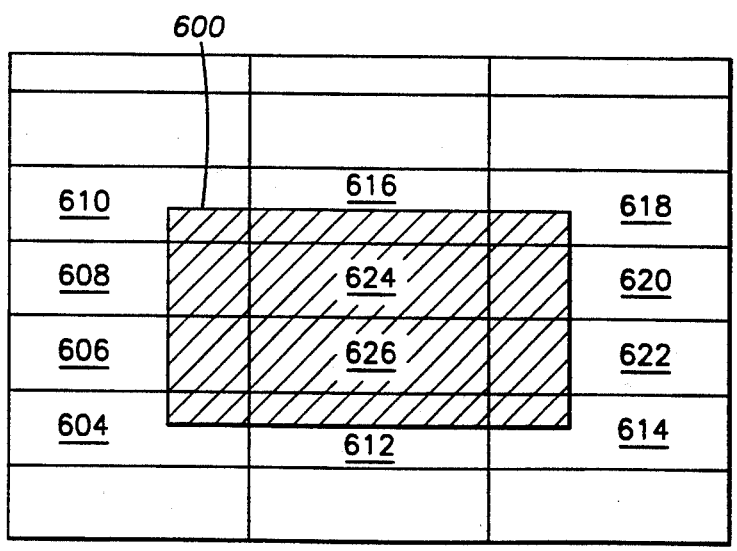
FIG. 6 is a diagram illustrating the operation of a query routine in a region 600.
Figure 5:
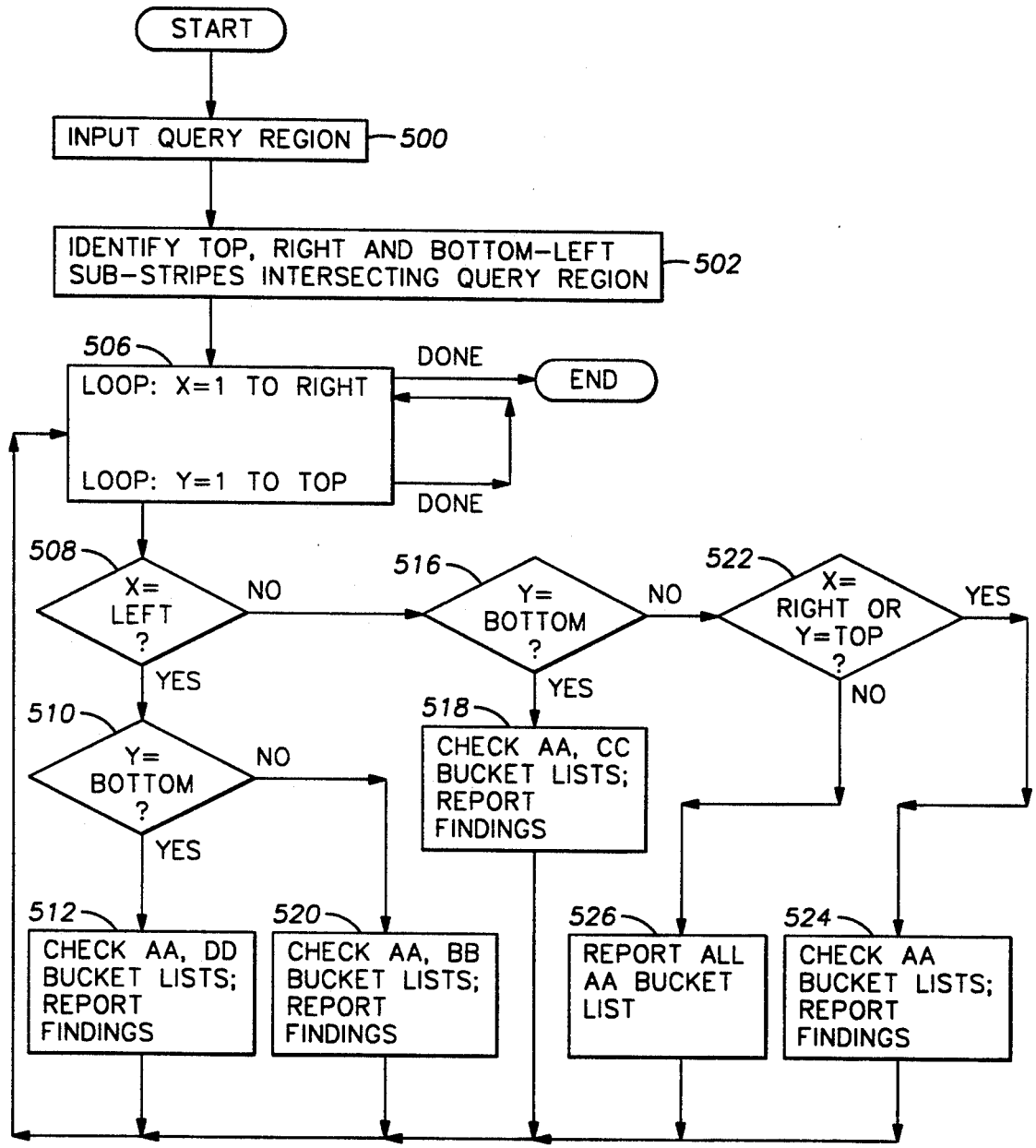
FIG. 5 is a flowchart illustrating the operation of a query routine of the present invention.

Referring now to FIGS. 5 and 6, a query routine will be described. FIG. 5 illustrates the steps in the query routine, and FIG. 6 shows a specific example illustrating the operation of the query routine. Generally, a "query" determines which objects are present in a specified rectangular "query region".

In step 500, the computer operator inputs the vertical and horizontal coordinates of the rectangular region 600 to be queried. Then, step 502 identifies the bottom-left sub-stripe 604 and top-right sub-stripe 618 of the sub-stripes intersecting the region 600.

Step 506 starts a loop that sequentially traverses through all sub-stripes intersecting the region 600. The loop begins with the sub-stripe 604 and ends with the sub-stripe 618. For each sub-stripe, the loop determines whether objects represented in the sub-stripe intersect the query region 600.

When branches 508 and 510 determine that the current sub-stripe is the bottom-left sub-stripe, step 512 asks whether any objects represented in any bucket list of the sub-stripe 604 intersect the query region 600.

All such intersecting objects are listed in a query output. Since this query lists objects contained in all bucket lists of the of the sub-stripe, it effectively lists all objects intersecting the query region 600. After step 512, the loop is advanced in step 506.

The loop progresses by further traversing along the bottom row of the query region 600, i.e. sub-stripes 612 and 614. When branches 508 and 516 determine that the current sub-stripe is on the bottom row of the region 600, and is not the bottom-left sub-stripe, step 518 asks whether any objects represented in the AA or CC bucket lists of the sub-stripe intersect the query region 600.

All such intersecting objects are listed in the query output. Task 518 therefore lists the objects that: (1) originate in the intersection between the query region 600 and the current sub-stripe, or (2) have a left edge that passes through the intersection. Objects having only a bottom edge in the intersection are not listed, since these objects would have already been listed in task 512.

The loop progresses in step 506 by traversing the next-higher horizontal row of sub-stripes, i.e. sub-stripes 606, 626, and 622. When branches 508 and 510 determine that the current sub-stripe is on the left row of the region 600, and is not the bottom-left sub-stripe, step 520 asks whether any objects represented in the AA or BB bucket lists of the current sub-stripe intersect the query region 600.

All such intersecting objects are listed in the query output. Task 520 therefore lists the objects that: (1) originate in the intersection between the query region 600 and the current sub-stripe, or (2) have a bottom edge that passes through the intersecting area. Objects having only a left edge in the intersection are not listed, since these objects would have already been listed in task 512.

When branches 508 and 516 determine that the current sub-stripe is not on the left row or the bottom row of the region 600, branch 522 asks whether the current sub-stripe is on the top or right row of the region 600. In the example of FIG. 6, these sub-stripes include sub-stripes 616, 618, 620, and 622. If branch 522 answers positively, step 524 then determines whether any objects represented in the AA bucket list of the current sub-stripe intersect the query region 600.

All such intersecting objects are listed in the query output. Task 524 therefore effectively lists the objects that originate in the intersection between the query region 600 and the current sub-stripe. Objects having only a bottom or left edge in the intersection are not listed, since these objects would have already been listed in tasks 518 or 520.

However, if branch 522 determines that the current sub-stripe is not on the top or right row of the region 600, i.e. is an "internal sub-stripe", step 526 automatically lists in the query output all objects represented in the AA bucket list of the current sub-stripe. In the example of FIG. 6, the internal sub-stripes include sub-stripes 624 and 626. Internal sub-stripes are only capable of containing one type of object that has not been reported in tasks 512, 518, 520, or 524—objects originating in the internal sub-stripes, i.e. objects represented in the AA bucket lists of internal sub-stripes.

Objects having only a bottom or left edge in an internal sub-stripes are not listed, since these objects would have already been listed in tasks 518 or 520. Therefore, step 526 automatically lists all objects represented in the AA bucket lists of the internal sub-stripes.

COMPARISONS

Speed

In a series of tests, the query speed of the invention was evaluated against the most efficient k-d tree available. The k-d tree used in these tests is described in "Geographical Data Structures Compared: A Study of Data Structures Supporting Region Queries" by Jonathan B. Rosenberg, IEEE Transactions on Computer-Aided Design, Vol. CAD-4, No. 1, January 1985. To measure the two systems on equal terms, all parameters of the system were precisely matched such that the only difference was the operation of the k-d tree versus the present invention.

All tests were run on a VAXSTATION 3100 spx ™ computer, which is a 32 bit, complex instruction set computer (CISC) machine, with a clock speed of approximately 6 million instructions per second. The test data selected was an actual VLSI production circuit, containing a typical aggregation of VLSI circuit elements, i.e. diverse sizes and aspect ratios. The results of the search are displayed below in Table I. In Table I, a "c.d.u." represents one CMOS (complementary medal oxide semiconductor) draw unit, which was approximately 0.75 micron at the time of the test.

TABLE I

| | Comparative Test Results | | |
|---|---|---|---|
| | | Avg. time (cpu sec) | |
| Test Case | Query Region | K-D Tree | Present Invention |
| Case 1 (approx. 400,000 objects) | 1400 c.d.u. × 1400 c.d.u. (entire chip, all objects) | 2.4 | 0.8 |
| | 600 c.d.u. × 600 c.d.u. | 0.7 | 0.3 |

TABLE I-continued
Comparative Test Results

| Test Case | Query Region | Avg. time (cpu sec) | |
|---|---|---|---|
| | | K-D Tree | Present Invention |
| | 600 c.d.u. × 900 c.d.u. | 1.6 | 0.6 |
| Case 2 (approx. 36,000,000 objects) | 4200 c.d.u. × 4200 c.d.u. (entire chip, all objects) | 22.0 | 4.5 |
| | 500 c.d.u. × 500 c.d.u. | 0.4 | 0.3 |
| | 1400 c.d.u. × 1400 c.d.u. | 1.4 | 0.6 |

As shown in the test results of Table I, the present invention accomplished all regional queries in less time than the comparable k-d tree queries. In particular, the present invention performed a 600 c.d.u. by 600 c.d.u. regional query of a chip with 400,000 objects nearly one half c.p.u. second faster than the comparable k-d tree query. In addition, the results of the 1400 c.d.u. by 1400 c.d.u. regional query of the chip with 400,000 objects, and the 4200 c.d.u. by 4200 c.d.u. regional query of the chip with 36,000,000 objects show that the present invention is even more efficient that the k-d tree with more complicated queries, i.e. larger query regions, and more objects.

Memory

Graphical data structures require a certain amount of memory that is independent of the amount of data stored in the structure. This memory, called "memory overhead", contains the structure used to organize the data. In the following examples, the computer is assumed to be a 32-bit machine, such that each integer or pointer requires 32 bits (4 bytes).

A typical k-d tree uses about 28 bytes of memory overhead for each node containing one object. The 28 bytes are allocated as follows: 1 left-side pointer (4 bytes), 1 integer for a right-side pointer (4 bytes), 1 pointer to the parent node (4 bytes), 1 pointer to the actual data (4 bytes), and 3 integers to store bounds information (12 bytes).

A "perfect" quad tree is one in which the area is divided successively until only one object exists in each quadrant. A perfect quad tree uses about 32 bytes of memory overhead for each node in a four quadrant arrangement containing one object. The 32 bytes are allocated as follows: 4 pointers, 1 for each quadrant (16 bytes); 1 pointer to the horizontal line (4 bytes); 1 pointer to the vertical line (4 bytes); 1 pointer to the parent (4 bytes); and 1 pointer to the actual object (4 bytes).

In contrast to k-d trees and quad trees, the present invention requires much less memory overhead per object. If an object falls completely within a single stripe, the memory overhead is 1 pointer to the object (4 bytes). If the object spans 2 stripes, 2 pointers (8 bytes) are used. In VLSI applications, the majority of objects are small, and the average memory overhead per object has been found to be about 5 bytes.

The present invention, then, provides a number of advantages over previously known arrangements. First of all, the software of the invention occupies significantly less computer memory than known systems. In particular, the present invention uses an average of 5 bytes of memory overhead. The present invention also accomplishes query, insert, and delete operations more quickly than known systems. Moreover, the invention is easily implemented since the source code is relatively concise, as shown in Table I.

Another important advantage of the present invention is its superior ability to accommodate graphical data of a variety of sizes and aspect ratios, such as that encountered in VLSI chip layouts. The invention accomplishes this, as described hereinabove, by classifying each object according to the sub-stripes intersecting the object, and by the portions of the object which are intersected by those sub-stripes. As a result, the present invention performs queries without the duplication of previously known graphical data structures.

While there have been shown what are presently considered to be preferred embodiments of the invention, it will be apparent to those skilled in the art that various changes and modifications can be made herein without departing from the scope of the invention as defined by the appended claims.

Appendix: C-Language Source Code

```
/*
            COPYRIGHT © 1988,1992
            DIGITAL EQUIPMENT CORPORATION
*/

/*
**      INCLUDE FILE
*/

/* declare TRUE and FALSE */ ifndef TRUE
define TRUE 1
#endif
#ifndef FALSE
#define FALSE 0
endif define INFINITY 0x7FFFFFFF
```

```
#define PUBLIC
#define PRIVATE static unsigned long
define SS$_NORMAL 1 define ICBM_K_END_HOLE 255         /*
                                    ** constant put in first_hole field of
                                    ** the BUCKET to indicate that there
                                    ** are no holes in the data array of
                                    ** the BUCKET (max data array
                                    ** size allowed is 254)
                                    */
#define NO_MBB_OFFSET -1
                                    /*
                                    ** offset of the MBB data from the
                                    ** object_ptr in the user's OBJECT
                                    ** data structure. Initialized to actual
                                    ** value in twod$insert_geom.
                                    */

/*
** Constants used as default values in the data structure
*/ define    DEFAULT_HIER_RATIO    3  /* stripe width factor from level to level */
define    DEFAULT_MAX_MESH_LEVELS 4        /* max num of stripe levels */

/*
 * the following 4 parameters can be user defined in icbm$create_geom()
 */
#define    DEFAULT_MAX_OBJ_IN_BKT 400 /* average objs in a bucket */
#define    DEFAULT_L_TO_W_RATIO  2.5 /* L to W aspect ratio of a bucket */
#define    DEFAULT_BUCKET_SIZE 20     /* default size of the data array in
                                       * each BUCKET.                   */
/*
** data structures for ICBM
*/ typedef struct KEY {
    int    llx;
    int    lly;
    int    urx;
    int    ury;
} KEY;

typedef struct BUCKET {                /* data structure to store user object ids */
    struct BUCKET  *next;              /* link to the next BUCKET              */
    unsigned char  first_hole;         /* pointer to first empty array location */
    unsigned char  data_count;         /* number of elements stored in the array */
    int            *dataptr;           /* pointer to the array of object_ids   */
} BUCKET;

typedef struct STRIPE {                /* structure for each STRIPE (hor. and ver.)*/
    BUCKET   **ss_sb_buckets;          /* array of bucket_lists for each bucket */
    BUCKET   **ss_xb_buckets;          /* four pointers required in each bucket */
    BUCKET   **xs_sb_buckets;
    BUCKET   **xs_xb_buckets;
```

```
                        /* ss_sb_buckets:start stripe, start bucket */
                        /* ss_xb_buckets:start stripe, xsect bucket */
                        /* xs_sb_buckets:xsect stripe, start bucket */
                        /* xs_xb_buckets:xsect stripe, xsect bucket */
                        /* For the purpose of illustration, let us say
                        ** that the x_stripes are along the x_axis. The
                        ** case of y_stripes along the y_axis would be
                        ** identical.
                        ** Now, If an object is wider along the x_dim
                        ** than along the y_dim, it will be stored in
                        ** in the x_stripes.
                        ** The stripe in which the lower y edge of the
                        ** object falls will classify the object as
                        ** start_stripe object. Further, if the object's
                        ** lower x edge falls in a bucket, the
                        ** the object will be stored in the bucket's
                        ** ss_  bucket. Look at the following picture.
                        */
/*
**
**      The object is shown as the rectangle drawn with ***.
**      In each bucket of the stripes that the object intersects with,
**      it is shown which of the four categories will the object be stored.
**
**              bucket 1    bucket 2    bucket 3    bucket 4    bucket 5
**           _____
** str 7| xs_sb_buck|   xs_xb   |   xs_xb   |   xs_xb   |   xs_xb   |
**      |           ************************************************|
**      |_____*_____*___
** str 6|xs_sb_buck |   xs_xb   |   xs_xb   |   xs_xb   |  xs_xb*   |
**      |     *     |           |           |           |    *      |
**      |_____*_____*___
** str 5|xs_sb_buck |   xs_xb   |   xs_xb   |   xs_xb   |  xs_xb*   |
**      |     *     |           |           |           |    *      |
**      |_____*_____*___
**      |xs_sb_buck |   xs_xb   |   xs_xb   |   xs_xb   |  xs_xb*   |
**      |     *     |           |           |           |    *      |
**      |_____*_____*___
**      |xs_sb_buck |   xs_xb   |   xs_xb   |   xs_xb   |  xs_xb*   |
**      |     *     |           |           |           |    *      |
**      |_____*_____*___
**      |xs_sb_buck |   xs_xb   |   xs_xb   |   xs_xb   |  xs_xb*   |
**      |     *     |           |           |           |    *      |
**      |_____*_____*___
** str 1|xs_sb_buck |   xs_xb   |   xs_xb   |   xs_xb   |  xs_xb*   |
**      |     *     |           |           |           |    *      |
**      |_____*_____*___
** str 0|ss_sb_buck | ss_xb_buck| ss_xb_buck| ss_xb_buck| ss_xb_buck|
**      |           ************************************************|
**      _____
**
**
*/
} STRIPE;

typedef struct MESH {       /*
                            ** structure to store the array of stripes of
```

```
                    ** given width that cover the entire user space
                    */
    STRIPE   *stripe;        /* array of stripes                            */
    int      stripe_width;   /* width of each stripe in array, same for all */
    int      num_stripes;    /* number of stripes in the array              */
    int      bucket_span;
    int      buckets_per_stripe;
} MESH;

typedef struct BUCKET_CONTEXT {        /*
                                       ** context structure storing all the
                                       ** control info and pointers to the stripes
                                       ** for each creat.. . of an ICBM context
                                       */
    char   lock;                /* not used currently */
    int    vm_zone;             /* vm_zone for ICBM's memory allocation */
    int    hier_ratio;          /*
                                ** multiplicative factor for stripe widths
                                ** from one level to the next in the hier
                                ** stripe structure
                                */
    int    max_mesh_levels;     /*
                                ** maximum mesh size (may be user defined
                                ** through icbm_optimize ()
                                */
    int    smallest_stripe_width;  /* width of the leaf stripes */ int    bucket_size;         /* size of data array in each bucket */ int    mbb_offset;          /* offset of MBB from beginning of data
                                ** initialized by twod$insert_geom
                                */
    MESH   *x_mesh;             /* mesh array for the x dim */
    MESH   *y_mesh;             /* mesh array for the x dim */ int    x_mesh_levels;       /* levels in the mesh hierarchy in x dim */
    int    y_mesh_levels;       /* levels in the mesh hierarchy in y dim */ int    llx,                 /* MBB of all the stripes and buckets */
           lly,
           urx,
           ury;

int    elem_count;          /*
                                ** tot number of data elements stored.
                                ** If an object intersects two buckets,
                                ** then two elements will be stored for the
                                ** object, one each in the two buckets.
                                */
    int    data_count;          /*
                                ** number of unique data objects stored by
                                ** the user
                                */
    int    relocate_count;      /*
                                ** number of unique data objects stored in
                                ** wrong stripes or buckets
                                */
```

```
        int     insert_count;
        BUCKET  *free_bkt_list;      /* list of completely empty buckets */
        int     bucket_count;        /* total num of bucket structs allocated */ char    optimized;           /* TRUE if the ICBM context is optimized */ int     max_objects_in_bucket; /* max objects acceptable in a bucket */
        float   l_to_w_ratio;        /* aspect ratio of a bucket */
} BUCKET_CONTEXT;

typedef struct USER_CONTEXT {       /*
                                    ** pointer to structure returned to the user
                                    ** as the ICBM context.
                                    */
        BUCKET_CONTEXT *bc;
} USER_CONTEXT;

/****************************************************************
 * !!!!!!!!!!!!!!!!!!   GENERIC MACROS    !!!!!!!!!!!!!!!!!!!!!!
 ****************************************************************/

/*
 * memory allocation macros implementing virtual memory zones
 */ ifdef VMS define LIB$M_VM_GET_FILL0 2 define CREATE_ZONE(z)  lib$create_vm_zone(&z, 0, 0, &LIB$M_VM_GET_FILL0, &1)

define DISPOSEZ(p, z) { lib$free_vm(&sizeof(*(p)), &p, &z); p = NULL; } define FREE_ZONE(z)   { lib$delete_vm_zone(&z); z=0; } define RESET_ZONE(z)  lib$reset_vm_zone(&z)

define NEWZ(p, z) { \
  p = NULL; \
  if (z==0) lib$stop(0); \
  lib$get_vm(&sizeof(*(p)), &p, &z); \
} define NEWZARRAY(count, p, z) { \
  int bytes = (count) * sizeof(*p); \
  p = NULL; \
  if (z==0) lib$stop(0); \
  lib$get_vm(&bytes, &p, &z); \
} define DISPOSEZ_ARRAY(count, p, z) { \
  int bytes = (count) * sizeof(*p); \
  lib$free_vm(&bytes, &p, &z); p = NULL; \
} define MAKE_STRINGZ(newstring, string, zone) {   \
```

```
  int bytes = strlen(string)+1;            \
  if (zone==0) lib$stop(0);                \
  lib$get_vm(&bytes, &newstring, &zone);   \
  strcpy(newstring, string);               \
  }
``` endif ifdef ULTRIX define LIB$M_VM_GET_FILL0 2 define CREATE_ZONE(z) plib$create_vm_zone(&z, 0, 0, &LIB$M_VM_GET_FILL0, &1,\
0, 0, 0, 0, 0, 0, 0, 0)

define DISPOSEZ(p, z) { plib$free_vm(&sizeof(*(p)), &p, &z); p = NULL; } define FREE_ZONE(z)   { lib$delete_vm_zone(&z); z=0; } define RESET_ZONE(z)  lib$reset_vm_zone(&z)

```
#define NEWZ(p, z) { \
  p = NULL; \
  if (z==0) plib$stop(1,0); \
  plib$get_vm(&sizeof(*(p)), &p, &z); \
} define NEWZARRAY(count, p, z) { \
  int bytes = (count) * sizeof(*p); \
  p = NULL; \
  if (z==0) plib$stop(1,0); \
  plib$get_vm(&bytes, &p, &z); \
} define DISPOSEZ_ARRAY(count, p, z) { \
  int bytes = (count) * sizeof(*p); \
  plib$free_vm(&bytes, &p, &z); p = NULL; \
} define MAKE_STRINGZ(newstring, string, zone) {   \
  int bytes = strlen(string)+1;            \
  if (zone==0) plib$stop(1,0);             \
  plib$get_vm(&bytes, &newstring, &zone);  \
  strcpy(newstring, string);               \
  }
``` endif

/*
 * memory allocation macros NOT implementing virtual memory zones
 */ define NEW(p) p = calloc(1,sizeof(*(p)))

define DISPOSE(p) free(p)

define CLEAR(s) {\

```
  int i;\
  for (i = 0;i<sizeof(s); i++)((char *) &(s))[i]=0;\
}
```

/*
** this is a work around for the bug in the vaxcrtl
*/
define LDA_REALLOC(p,s) (((p)==NULL)?malloc(s):realloc((p),(s)))

define MAKE_STRING(s) strcpy(calloc(strlen(s)+1, 1), s)

define FREE_STRING(s) free(s)

define NEWARRAY(count, p) p = calloc(count,sizeof(*(p)))

/*
 * status checking macros
 */ ifdef VMS define NORMAL(p) ((p & 7) == 1)

define SUCCESS(p) ((p & 1) == 1)

define RETURN_ON_ERROR(p) {if (p == ICBM_ERROR) return (p);} define RETURN_NOT_NORMAL(p) {if (!NORMAL(p)) return (p);} define RETURN_NOT_SUCCESS(p) {if (!SUCCESS(p)) return (p);} define EXIT_NOT_SUCCESS(p) {if (!SUCCESS(p)) sys$exit(p);} define SIGNAL_NOT_SUCCESS(p) { if (!SUCCESS(p)) {lib$signal(p); return;}} define STOP_NOT_SUCCESS(p) {if (!SUCCESS(p)) lib$stop(p);} define MONITOR_NOT_SUCCESS(p, e) { if (!SUCCESS(p)) {lib$signal(p);e = TRUE;}} endif ifdef ULTRIX define NORMAL(p) ((p & 7) == 1)

define SUCCESS(p) ((p & 1) == 1)

define RETURN_ON_ERROR(p) {if (p == LDA_ERROR) return (p);} define RETURN_NOT_NORMAL(p) {if (!NORMAL(p)) return (p);} define RETURN_NOT_SUCCESS(p) {if (!SUCCESS(p)) return (p);} define SIGNAL_NOT_SUCCESS(p) { if (!SUCCESS(p)) \
{plib$signal(1, p); return;}} define STOP_NOT_SUCCESS(p) {if (!SUCCESS(p)) plib$stop(1, p);}

```c
#define MONITOR_NOT_SUCCESS(p, e) { if (!SUCCESS(p)) \
{plib$signal(1, p); e = TRUE;}} endif

/*
 * rounding macros
 */ define MOD(x, b) ((x) < 0 ? (((x) % (b)) + (b)) % (b) : (x) % (b))

define ROUND_DOWN(x, b) (x - MOD(x, b))

#define ROUND_UP(x, b) (x + MOD(b - (x), b))

#define ROUND_NEAREST(x, b) ROUND_DOWN(x + (b)/2, b)

/*
 * min/max macros
 */
#define ABS(x) (x < 0 ? -x : x)

#define MAX2(a,b) ((a) > (b) ? (a) : (b))

#define MIN2(a,b) ((a) < (b) ? (a) : (b))

#define MAX3(a,b,c)   (MAX2((MAX2((a),(b))), (c)))

#define MIN3(a,b,c)   (MIN2((MIN2((a),(b))), (c)))

/*
 * string handling macros
 */ define STREQU(s1, s2) (!strcmp(s1, s2))

define STRNEQU(s1, s2, l) (!strncmp(s1, s2, l))

#define SAFECPY(s1, s2) strncpy(s1, s2, sizeof(s1))

#define STRZCPY(s1, s2, n) ((char *) strncpy(s1, s2, n))[n] = 0;

#define UPCASE(s) { \
    int j = strlen(s);\
    int i; for (i = 0;(isascii(s[i]) && (i <= j));i++) s[i] = toupper(s[i]);}

/***************************************************************
!!!!!!!!!!!!! MBB macros (modify suitably for given application) !!!!!
***************************************************************/ define OFFSET(bc, x) (((char *)(x)) + (bc->mbb_offset))
define LLX(k) (*((int *)(k)))
#define LLY(k) (*(((int *)(k)) + 1))
#define URX(k) (*(((int *)(k)) + 2))
#define URY(k) (*(((int *)(k)) + 3))
```

```c
/****************************************************************
!!!!!!!!!!!!!!!!!  program specific MACROS   !!!!!!!!!!!!!!!!!!!!!!
****************************************************************/
/*
** given a user_context, return the bucket_context pointer
*/
#define BC(ucptr)        (((USER_CONTEXT *)(*ucptr))->bc)

/*
** return the lock field of the bucket_context
*/
#define LOCK(bc)   (bc->lock)
/*
** lock bucket_context
*/
#define ICBM_LOCK(bc) {bc->lock = 1;}
/*
** unlock_bucket_context
*/
#define ICBM_UNLOCK(bc) {bc->lock = 0;}

/*
** check if optimization is desired (if more then 25% need relocation)
** and number of relocatable objects is more than 2*max_objects
*/
/******
#define MIN_RELOCATE_COUNT(bc) \
                    (bc->relocate_count > (2 * bc->max_objects_in_bucket))

#define RELOCATE_CRITERIA(bc)  (((bc->relocate_count*100/bc->data_count)) > 25)

#define OPTIMIZE_NEEDED(bc) \
    ((MIN_RELOCATE_COUNT(bc) && RELOCATE_CRITERIA(bc)) ? TRUE : FALSE)
******/
#define RELOCATE_CRITERION(bc)  (bc->relocate_count > (bc->data_count / 5))

#define INSERT_CRITERION(bc)  (ABS(bc->insert_count) > (bc->data_count / 4))

#define OPTIMIZE_NEEDED(bc) \
        ((INSERT_CRITERION(bc) || RELOCATE_CRITERION(bc)) ? TRUE : FALSE)

/*
** translate x & y by the bucket_context->lower_left coord
** so that all data lies in the (+x,+y) quadrant
*/
#define X_IN(x, bc) ((x) - bc->llx)
#define Y_IN(y, bc) ((y) - bc->lly)
/*
** translate back x & y by the bucket_context->lower_left coord
** so that all data reverts to the original coordinates
*/
#define X_OUT(x, bc) ((x) + bc->llx)

#define Y_OUT(y, bc) ((y) + bc->lly)
/*
** Find the stripe that coord x will fall in the x_dim
*/
```

```
#define XSTR(mp, x, bc) \
        (MAX2(MIN2(((X_IN(x,bc))/mp->stripe_width),(mp->num_stripes - 1)),0))
/*
** Find the stripe that coord y will fall in the y_dim
*/
#define YSTR(mp, y, bc) \
        (MAX2(MIN2(((Y_IN(y,bc))/mp->stripe_width),(mp->num_stripes - 1)),0))
/*
** Find the bucket that coord x will fall in the x_dim
*/
#define XBKT(x, mp) \
    (MAX2(MIN2((X_IN(x,bc))/mp->bucket_span, mp->buckets_per_stripe - 1),0))
/*
** Find the bucket that coord x will fall in the y_dim
*/
#define YBKT(y, mp) \
    (MAX2(MIN2((Y_IN(y,bc))/mp->bucket_span, mp->buckets_per_stripe - 1),0))
/*
** check if MBB of object is wider in X or wider in Y
*/
#define X_OR_Y(data) ((URX(data) - LLX(data)) > (URY(data) - LLY(data)))
/*
** lowest stripe that the data object intersects
*/
#define LO_STRIPE(mp, data, bc) \
        ( X_OR_Y(data) ? (YSTR(mp, LLY(data),bc)):(XSTR(mp, LLX(data),bc)))
/*
** highest stripe that the data object intersects
*/
#define HI_STRIPE(mp, data, bc) \
        ( X_OR_Y(data) ? (YSTR(mp, URY(data),bc)):(XSTR(mp, URX(data),bc)))
/*
** lowest bucket that the data object intersects
*/
#define LO_BUCKET(data, mp) \
        ( X_OR_Y(data) ? XBKT(LLX(data), mp) : YBKT(LLY(data), mp))
/*
** highest bucket that the data object intersects
*/
#define HI_BUCKET(data, mp) \
        ( X_OR_Y(data) ? XBKT(URX(data), mp) : YBKT(URY(data), mp))
/*
** lowest stripe that the data object intersects among the stripes
** that are not skewed the same as the data MBB. So if the data is wider
** in X than it is in Y, we have to find the WL(wrong layer) stripe
** intersection from among the stripes that are along the Y axis.
*/
#define WL_LO_STRIPE(mp, data, bc) \

( (!X_OR_Y(data)) ? (YSTR(mp,LLY(data),bc)):(XSTR(mp,LLX(data),bc)))

#define WL_HI_STRIPE(mp, data, bc) \
        ( (!X_OR_Y(data)) ? (YSTR(mp,URY(data),bc)):(XSTR(mp,URX(data),bc)))
/*
** Lowest bucket from the wrong layer stripes intersecting the data
*/
#define WL_LO_BUCKET(data, mp) \
        ( (!X_OR_Y(data)) ? XBKT(LLX(data), mp) : YBKT(LLY(data), mp))
```

```
#define WL_HI_BUCKET(data, mp) \
        ( (!X_OR_Y(data)) ? XBKT(URX(data), mp)  : YBKT(URY(data), mp))
```
/*
** given the data, find the mesh level on which the data will be stored
** i.e., if the data is small, it will filter down to the smallest stripes
** else it might be stored on some higher stripe level
*/
```
#define MESH_PTR( mp, data, bc ) {\
    int i;\
    if ( X_OR_Y(data) ) {\
        for( i = 0; i < bc->x_mesh_levels; i++) {\
            if ( (HI_STRIPE((bc->x_mesh + i), data, bc) -\
                  LO_STRIPE((bc->x_mesh + i), data, bc)) <= 1 ) {\
                mp = bc->x_mesh + i;\
                break;\
            }\
        }\
        if ( i == bc->x_mesh_levels ) {\
            mp = bc->x_mesh + (bc->x_mesh_levels - 1);\
        }\
    } else {\
        for( i = 0; i < bc->y_mesh_levels; i++) {\
            if ( (HI_STRIPE((bc->y_mesh + i), data, bc) -\
                  LO_STRIPE((bc->y_mesh + i), data, bc)) <= 1 ) {\
                mp = bc->y_mesh + i;\
                break;\
            }\
        }\
        if ( i == bc->y_mesh_levels ) {\
            mp = bc->y_mesh + (bc->y_mesh_levels - 1);\
        }\
    }\
}
```

/*
** If relocation of the data is necessary return TRUE.
*/
```
#define RELOCATE_DATA(data, bc) \
    (bc->llx > LLX(data) || bc->urx < URX(data) || \
     bc->lly > LLY(data) || bc->ury < URY(data))
```

/*
** compute and store the next empty array slot's index in the first_hole field
** If no empty slot left, then store ICBM_K_END_HOLE in the first field.
*/
```
#define NEXT_HOLE( bucket_ptr, bc )\
        { int i;\
            for( i = bucket_ptr->first_hole + 1; i < bc->bucket_size; i++) {\
                if( bucket_ptr->dataptr[i] == 0 ) {\
                    bucket_ptr->first_hole = i;\
                    break;\
                }\
            }\
            if( i == bc->bucket_size ) {\
                bucket_ptr->first_hole = ICBM_K_END_HOLE;\
            }\
```

```
            }
/*
** Get a new bucket completely initialized to zeroes.
*/
#define NEW_BUCKET(bptr, bc) \
        { \
          if (bc->free_bkt_list!=NULL) { \
             bptr = bc->free_bkt_list; \
             bc->free_bkt_list = bc->free_bkt_list->next; \
             bptr->next = NULL; \
             bptr->data_count = 0; \
             memset(bptr->dataptr, 0, bc->bucket_size*sizeof(int)); \
                bptr->first_hole = 0;\
          } else { \
             NEWZ(bptr, bc->vm_zone); \
             NEWZARRAY(bc->bucket_size, bptr->dataptr, bc->vm_zone); \
             bc->bucket_count++;\
                bptr->first_hole = 0;\
          } \
        }
/*
** return bucket structure to VM.
*/
#define FREE_BUCKET(bptr, bc) \
        { \
          DISPOSEZ_ARRAY(bc->bucket_size, bptr->dataptr, bc->vm_zone); \
          DISPOSEZ(bptr, bc->vm_zone); \
          bc->bucket_count--;\
        }

/*
** Add bucket to an existing bucket_list
*/
#define ADD_BUCKET(blist, bptr) \
        {\
            bptr->next = blist;\
            blist = bptr;\
        }

/*
** Remove bucket from the bucket list
*/
#define RELEASE_BUCKET(blist, bptr, bc) \
        { BUCKET *cptr, *pptr;\
          pptr = NULL;\
          for( cptr = blist; cptr != NULL; \
               pptr = cptr, cptr = cptr->next) {\
             if( cptr == bptr )\
                break;\
          }\
          if( cptr == NULL ) {\
             blist = bptr;\
             FREE_BUCKET(cptr, bc);\
          } else {\
             pptr->next = bptr->next;\
             FREE_BUCKET(cptr, bc);\
          }\
```

```
        }
/*
** check if the data intersects or abuts the key (OVERLAP_ABUT)
*/
#define INTERSECT_OVERLAP_ABUT(data, key, flag) \
        {   flag = FALSE;\
            if((URX(key) >= LLX(data)) && (URY(key) >= LLY(data)) &&\
                (URY(data) >= LLY(key)) && (URX(data) >= LLX(key))) {\
                    flag = TRUE;\
            }\
        }

/*
** check if the data intersects (no abutment allowed) the key (OVERLAP only)
*/
#define INTERSECT_OVERLAP(data, key, flag) \
        {   flag = FALSE;\
            if((URX(key) > LLX(data)) && (URY(key) > LLY(data)) &&\
                (URY(data) > LLY(key)) && (URX(data) > LLX(key))) {\
                    flag = TRUE;\
            }\
        }

/*
** check if abutment but no overlap of the key (ABUTMENT only)
*/
#define INTERSECT_NOOVERLAP_ABUT(data, key, flag) \
        {   flag = FALSE;\
            INTERSECT_OVERLAP(data, key, flag); \
            flag = (flag == TRUE ? FALSE : TRUE); \
            if (flag == TRUE) \
                INTERSECT_OVERLAP_ABUT(data, key, flag); \
        }

/*
** check if no abutment and no overlap of the key
*/
#define INTERSECT_NOOVERLAP_NOABUT(data, key, flag) \
        {   flag = FALSE;\
            INTERSECT_OVERLAP_ABUT(data, key, flag); \
            flag = (flag == TRUE ? FALSE : TRUE); \
        } define FILTER_SEARCH_OBJECT(search_type, data_key, key, flag) \
    { \
        switch (search_type) { \
            case TWOD$K_SEARCH_OVERLAP: \
                INTERSECT_OVERLAP(data_key, key, flag ); \
                break; \
            case TWOD$K_SEARCH_OVERLAP_ABUT: \
                INTERSECT_OVERLAP_ABUT(data_key, key, flag ); \
                break; \
            case TWOD$K_SEARCH_NOOVERLAP_ABUT: \
                INTERSECT_NOOVERLAP_ABUT(data_key, key, flag ); \
                break; \
```

```
            case TWOD$K_SEARCH_NOOVERLAP_NOABUT: \
                INTERSECT_NOOVERLAP_NOABUT(data_key, key, flag ); \
                break; \
            default: \
                STOP_NOT_SUCCESS(0); \
        } \
    }
```

```
/*
**      MAIN PROGRAM
*/ include <stdio.h> include "icbm_public.h"
include "icbm_message.h"
#include "icbm.h"
include <math.h> ifdef VMS
include <varargs.h>
#endif

PRIVATE         insert_data();
PRIVATE         delete_data( );
PRIVATE         find_intersecting_data();
PRIVATE .       add_free_buckets();
PRIVATE         release_free_buckets();
PRIVATE         release_bucket();
PRIVATE         compute_and_allocate_stripes();
PRIVATE         icbm_delete_bucket_context();
PRIVATE         calculate_xmesh_mbb();
PRIVATE         calculate_ymesh_mbb();
PRIVATE         get_new_bucket_dims();

/*
**
**      ICBM : Intelligent & Compact Bucketing Method
**
** OBJECTIVE:
**
**      Prototype to test the PERFORMANCE of a bucketing
**      scheme for geometrical access of layout data.
**
** STRATEGY:
**
**      o We will create two sets of orthogonal stripes, one set in x and one set
**        in the y direction.
**
**      o The stripes themselves will be of a user defined width. In the absence
**        of user specification, it will be set to a default value by ICBM.
**
**      o Each stripe along each axis will hold MBB's that:
**              * are longer along that axis than the other axis.
**                (square MBB's will be treated as short and fat)
**              * and intersect the stripe/bucket.
```

```
**      o  The stripes will be subdivided into buckets that will actually have
**         lists of elements intersecting the bucket area.
**
**      o  The buckets will store data_ptrs in chunks of fixed size array
**         structures, which will be linked together.
**
** MEMORY REQUIREMENT:
**
**      The base memory requirement should equal:
**
**              4  bytes per object *
**                 ave. num of buckets an object xsects (1.1 empirically)
**
**           +  4  bytes per bucket structure, where each bucket stores say
**                 20 data elements (by default).
**
**           +  overhead for stripes and mesh data structures.
**
**           +  some empty data array locations in bucket lists.
**
**
** TWOD COMPATIBILITY:
**
**      To ensure that replacing TWOD with ICBM requires as little change
**      in the application routines as possible, we have decided to DUPLICATE
**      TWOD's calling interface. This way we are guaranteed that replacing
**      TWOD with ICBM will require minimal changes, of any, in the application.
**      Therefore, all the PUBLIC routines are named TWOD$* and some of them
**      take parameters that they do not need or do not use.
*/

/**
** The following procedure accepts the parameters to be set for sizing
** buckets
**/
PUBLIC int icbm$create_geom(
    int         *user_context,
    int         bucket_size,            /* size of a linked array for
                                                            storage */
    int         average_objs_in_bucket, /* average acceptable objects in a
                                                            bucket */
    int         l_to_w_ratio            /* aspect ratio in percentage,
                                                            i.e. 2.5=>250 */
)
{

USER_CONTEXT    *uc;
    BUCKET_CONTEXT  *bc;
    STRIPE          *sptr;
    int             i,j,k;

uc = (USER_CONTEXT *)   calloc(1, sizeof(USER_CONTEXT));
    bc = (BUCKET_CONTEXT *) calloc(1, sizeof(BUCKET_CONTEXT));
    CREATE_ZONE(bc->vm_zone);
```

```
    bc->mbb_offset = NO_MBB_OFFSET;
    bc->hier_ratio = 1;
    bc->max_mesh_levels = 1;
    bc->smallest_stripe_width = INFINITY;
    /*
     * Set the parametes to requested values
     */
    bc->bucket_size = bucket_size;
    bc->max_objects_in_bucket = average_objs_in_bucket;
    bc->l_to_w_ratio = l_to_w_ratio / 100.0;
                                    /* converted to a floating value */ compute_and_allocate_stripes( bc );

uc->bc = bc;
    (*user_context) = uc;

return SS$_NORMAL;
}

PUBLIC int twod$create_geom(
    int         *user_context,  /* context to be returned.              */
    int         *key_type)      /* key_type not used in ICBM. The parameter is*/
                                /* left as a dummy for TWOD plug compatibitly.*/
                                /* right now, the only key_type supported by */
                                /* Right now, only INTEGER keys are supported */
                                /* by ICBM.                             */
{
    USER_CONTEXT    *uc;
    BUCKET_CONTEXT  *bc;
    STRIPE          *sptr;
    int             i,j,k;

uc = (USER_CONTEXT *) calloc(1, sizeof(USER_CONTEXT));
    bc = (BUCKET_CONTEXT *) calloc(1, sizeof(BUCKET_CONTEXT));
    CREATE_ZONE(bc->vm_zone);

bc->mbb_offset = NO_MBB_OFFSET;
    bc->hier_ratio = 1;
    bc->max_mesh_levels = 1;
    bc->smallest_stripe_width = INFINITY;
    /*
     * Initaially set the parametes to default values
     */
    bc->bucket_size = DEFAULT_BUCKET_SIZE;
    bc->max_objects_in_bucket = DEFAULT_MAX_OBJ_IN_BKT;
    bc->l_to_w_ratio = DEFAULT_L_TO_W_RATIO;

compute_and_allocate_stripes( bc );

uc->bc = bc;
    (*user_context) = uc;

return SS$_NORMAL;
}
```

```c
PUBLIC int twod$insert_geom(
    int         *user_context,
    int         *junk_key,      /* Used to decide mbb offset(temporary hack) */
                                /* put here for TWOD compatibility          */
    char        **dataptr,      /* address of the data to be stored         */
    int         *node)          /* Again, not needed but left for TWOD compat */
                                /* TWOD returns a pointer to the node_object */
                                /* it creates for an object. This pointer is */
                                /* later used by TWOD for deleting the node  */
                                /* any object in twod$delete_object          */
{
    BUCKET_CONTEXT      *bc = BC(user_context);
    int                 *data_key;
    STRIPE              *sptr,
                        *stripe_ptr;
    MESH                *mptr;
    BUCKET              **bptr_ptr;

int                 i,j,k,hi,lo;
    int                 argcount;
    int         lo_stripe, hi_stripe;
    int         lo_bucket, hi_bucket;

#ifdef VMS
    va_count(argcount);

if( argcount == 4 ) { /* since all parameters are pointers (long words) */
        *node = *dataptr; /* for twod */
    }
endif ifdef ULTRIX
    if( node != NULL ) { /* since all parameters are pointers (long words) */
        *node = *dataptr; /* for twod */
    }
endif /*
    ** Set the mbb_offset field if it is not set
    */ if (bc->mbb_offset == NO_MBB_OFFSET)
        bc->mbb_offset = ((int)(junk_key)) - ((int)(*dataptr));

/*
    ** Initialize the data_key
    */
    data_key = OFFSET(bc, *dataptr);

MESH_PTR(mptr, data_key, bc);

lo_stripe = LO_STRIPE(mptr, data_key, bc);
    hi_stripe = HI_STRIPE(mptr, data_key, bc);
    lo_bucket = LO_BUCKET(data_key, mptr);
    hi_bucket = HI_BUCKET(data_key, mptr);
    for( i = lo_stripe;
         i <= hi_stripe;
```

```
        i++) {
    sptr = mptr->stripe + i;
    for( j = lo_bucket;
         j <= hi_bucket;
         j++) {
        if ( i == lo_stripe ) {
            if ( j == lo_bucket) {
                insert_data(sptr->ss_sb_buckets + j, dataptr, bc );
            } else {
                insert_data(sptr->ss_xb_buckets + j, dataptr, bc );
            }
        } else {
            if ( j == lo_bucket) { insert_data(sptr->xs_sb_buckets + j, dataptr, bc );
            } else {
                insert_data(sptr->xs_xb_buckets + j, dataptr, bc );
            }
        }
    }
} if (RELOCATE_DATA(data_key, bc))
    bc->relocate_count++;

bc->data_count++;
bc->insert_count++;
return SS$_NORMAL;
}

PUBLIC int twod$delete_geom(
    int         *user_context,
    char        **dataptr)      /* address of the data to be deleted */
{
    int                 *data_key;
    BUCKET_CONTEXT      *bc = BC(user_context);
    STRIPE              *sptr,
                        *stripe_ptr;
    MESH                *mptr;
    BUCKET              **bptr_ptr;
    int                 i,j,k,hi,lo;
    int                 argcount;
    int                 lo_stripe, hi_stripe;
    int                 lo_bucket, hi_bucket;

#ifdef VMS
    va_count(argcount);

if( argcount == 1 ) { /* delete the entire tree (as per TWOD convention) */
        icbm_delete_bucket_context( bc );
        DISPOSE(*user_context);
        return SS$_NORMAL;
    } else {
        if ( *dataptr == NULL ) { /* delete entire tree */
            icbm_delete_bucket_context( bc );
            DISPOSE(*user_context);
            return SS$_NORMAL;
```

```
        }
            data_key = OFFSET(bc, *dataptr);
    }
endif ifdef ULTRIX if( *dataptr == NULL ) { /* delete the entire tree (as per TWOD convention) */
        icbm_delete_bucket_context( bc );
        DISPOSE(*user_context);
        return SS$_NORMAL;
    } else {
        data_key = OFFSET(bc, *dataptr);
    } endif

MESH_PTR(mptr, data_key, bc);

lo_stripe = LO_STRIPE(mptr, data_key, bc);
    hi_stripe = HI_STRIPE(mptr, data_key, bc);
    lo_bucket = LO_BUCKET(data_key, mptr);
    hi_bucket = HI_BUCKET(data_key, mptr);
    for( i = lo_stripe;
         i <= hi_stripe;
         i++) {
        sptr = mptr->stripe + i;
        for( j = lo_bucket;
             j <= hi_bucket;
             j++) {
            if ( i == lo_stripe ) {
                if ( j == lo_bucket) {
                    delete_data(sptr->ss_sb_buckets + j, dataptr, bc);
                } else {
                    delete_data(sptr->ss_xb_buckets + j, dataptr, bc);
                }
            } else {
                if ( j == lo_bucket) {
                    delete_data(sptr->xs_sb_buckets + j, dataptr, bc);
                } else {
                    delete_data(sptr->xs_xb_buckets + j, dataptr, bc);
                }
            }
        }
    } if (RELOCATE_DATA(data_key, bc))
      bc->relocate_count--;

bc->data_count--;
    bc->insert_count--;

return SS$_NORMAL;
}

/*
** checks data elements in the bucket_list fbptr for those that intersect
```

```
** the suppied key. If they do, invokes callback routine
**
** TWOD uses three status flags to manipulate objects and suspend search in its
** structures. These flags are used by ICBM as well for compatibility reasons.
** These flags are used in twod$search_geom() and twod$traverse_geom() and in
** find_intersecting_data() which is called by the search and traverse routines.
**
** 1.   TWOD$_DELNOD -   If the user callback routine returns this status,
**                      TWOD/ICBM will delete the node it is curently visiting
**                      (which it sent into the user callback) and continue on.
**
** 2.   TWOD$_OPEABO -   If the user callback routine returns this status,
**                      TWOD/ICBM will stop the search or traverse that it is
**                      currently performing and return control to the user.
**
** 3.   TWOD$_DELABO -   If the user callback routine returns this status,
**                      TWOD/ICBM will delete the node it is curently visiting
**                      (which it sent into the user callback) and THEN
**                      TWOD/ICBM will stop the search or traverse that it is
**                      currently performing and return control to the user.
*/

PRIVATE int find_intersecting_data(
    BUCKET       **fbptr,            /* pointer to a bucket list */
    int          *key,               /* search key */
    int          search_type,        /* type of search */
    int          (*search_callback)(), /* callback routine */
    int          user_data,
    BUCKET_CONTEXT *bc,
    int          *user_context)
{
    BUCKET *bptr, *nbptr;
    int    *data;
    int    *data_key;
    int    k,flag,bkt_del_flag,status;
    int    obj_count,obj_total;

if ( *fbptr != NULL ) {
        for (bptr = *fbptr; bptr != NULL; bptr = nbptr) {
            nbptr = bptr->next;
            k = 0;
            obj_count = 0;
            obj_total = bptr->data_count;
            while(obj_count < obj_total) {
                if(k >= bc->bucket_size) break;
                if( (data = bptr->dataptr[k]) != 0 ) {
                    obj_count++;
                    data_key = OFFSET(bc, data);
                    FILTER_SEARCH_OBJECT(search_type, data_key, key, flag);
                    if ( flag ) {
                        status =
                        (*search_callback)(&(bptr->dataptr[k]),
                               &(bptr->dataptr[k]), user_data);
                        if( status == TWOD$_DELNOD ) {
                            twod$delete_geom( user_context, &data );
                        } else if ( status == TWOD$_OPEABO ) {
```

```
                return (status);
            } else if ( status == TWOD$_DELABO ) {
                twod$delete_geom( user_context, &data );
                return (status);
            } else
                STOP_NOT_SUCCESS(status);
            }
        }
        k++;
        }
    }
}
    return SS$_NORMAL;
}

PUBLIC int twod$search_geom(
    int     *user_context,
    int     *key,                              /* search key */
    int     *search_type,
    int     (*search_callback)(),
    int     user_data)
{
    KEY                   overlap,
                          *optr = &overlap;
    BUCKET_CONTEXT        *bc = BC(user_context);
    MESH                  *mptr;
    STRIPE                *sptr, *stripe_ptr;
    BUCKET                *bptr, *fbptr, *nbptr;
    int                   h,i,j,k,bkt_del_flag,status;
    int                   flag;
    int                   *data_key;
    int                   lo_stripe, hi_stripe;
    int                   lo_bucket, hi_bucket;
    int                   mesh_levels;
    char                  *data;
    int                   obj_count,obj_total;

if( bc->data_count == 0 ) {
        return SS$_NORMAL;
    } if(LLX(key) <= bc->llx && LLY(key) <= bc->lly &&
                URX(key) >= bc->urx && URY(key) >= bc->ury){
    twod$traverse_geom(user_context,search_callback,user_data);

return SS$_NORMAL;
    }

/*
** If the context has not been optimized, then call icbm_optimize()
** Currently, the parameters sent to icbm_optimize are hard codd in the
** call, we cannot read such user definitions through the curent TWODTREE
** interface.
```

```
*/
/*
** If the number of objects are less than bc->max_objects_in_bucket
** (arbitrary) then do nothing.
*/ if(   (bc->data_count > bc->max_objects_in_bucket) &&
                            (!bc->optimized || OPTIMIZE_NEEDED(bc))) {
            icbm_optimize( user_context,
                    DEFAULT_HIER_RATIO,
                    DEFAULT_MAX_MESH_LEVELS,
                    bc->bucket_size);
            bc = BC(user_context);
        }

/*
    ** If there are empty buckets in this list, return them to VM
    */
/****
        release_free_buckets ( bc );
*****/

/*
    ** search the stripes that have the same orientation as the search window
    */
    mesh_levels = (X_OR_Y(key) ? bc->x_mesh_levels: bc->y_mesh_levels);
    for ( h = 0; h < mesh_levels; h++) {
            mptr = (X_OR_Y(key) ? bc->x_mesh : bc->y_mesh) + h;
        lo_stripe = LO_STRIPE(mptr, key, bc);
        hi_stripe = HI_STRIPE(mptr, key, bc);
        lo_bucket = LO_BUCKET(key, mptr);
        hi_bucket = HI_BUCKET(key, mptr);
          for( i = lo_stripe;
             i <= hi_stripe;
             i++) {
            sptr = mptr->stripe + i;

if ( i == lo_stripe ) {
        /* search buckets in lowest stripe */
                for( j = lo_bucket;
                    j <= hi_bucket;
                    j++ ) {
                    if ( j == lo_bucket ) {
                        status = find_intersecting_data(sptr->ss_sb_buckets + j,
                                    key,*search_type,
                                search_callback,user_data,
                                    bc,user_context);

if ( status == TWOD$_DELABO || status == TWOD$_OPEABO)
                    return TWOD$_OPEABO;
                status = find_intersecting_data(sptr->xs_sb_buckets + j,
                            key,*search_type,
                        search_callback,user_data,
                            bc,user_context);
                if ( status == TWOD$_DELABO || status == TWOD$_OPEABO)
                    return TWOD$_OPEABO;
                status = find_intersecting_data(sptr->ss_xb_buckets + j,
```

```
                    key,*search_type,
              search_callback,user_data,
                    bc,user_context);
        if ( status == TWOD$_DELABO || status == TWOD$_OPEABO)
            return TWOD$_OPEABO;
        status = find_intersecting_data(sptr->xs_xb_buckets + j,
                    key,*search_type,
              search_callback,user_data,
                    bc,user_context);
        if ( status == TWOD$_DELABO || status == TWOD$_OPEABO)
            return TWOD$_OPEABO;
    } else {
        status = find_intersecting_data(sptr->ss_sb_buckets + j,
                    key,*search_type,
              search_callback,user_data,
                    bc,user_context);
        if ( status == TWOD$_DELABO || status == TWOD$_OPEABO)
            return TWOD$_OPEABO;
        status = find_intersecting_data(sptr->xs_sb_buckets + j,
                    key,*search_type,
              search_callback,user_data,
                    bc,user_context);
        if ( status == TWOD$_DELABO || status == TWOD$_OPEABO)
            return TWOD$_OPEABO;
    }
  }
} else {
/* search buckets in all stripes except the lowest stripe */
    for( j = lo_bucket; j <= hi_bucket; j++ ) {
        if ( j == lo_bucket ) { /* crosses a bucket edge */
            status = find_intersecting_data(sptr->ss_sb_buckets + j,
                        key,*search_type,
                  search_callback,user_data,
                        bc,user_context);
            if ( status == TWOD$_DELABO || status == TWOD$_OPEABO)
                return TWOD$_OPEABO;
            status = find_intersecting_data(sptr->ss_xb_buckets + j,
                        key,*search_type,
                  search_callback,user_data,
                        bc,user_context);
            if ( status == TWOD$_DELABO || status == TWOD$_OPEABO)
                return TWOD$_OPEABO;
        } else if ((j < hi_bucket) && (i < hi_stripe)) { for (bptr = sptr->ss_sb_buckets[j];
                    bptr != NULL; bptr = nbptr) {
                nbptr = bptr->next;
                k = 0;
                obj_count = 0;
                obj_total = bptr->data_count;
                while(obj_count < obj_total) {
                    if(k >= bc->bucket_size) break;
                    if( (data = bptr->dataptr[k]) != 0 ) {
                        obj_count++;
                        data_key = OFFSET(bc, data);
                        FILTER_SEARCH_OBJECT(*search_type, data_key,
                                key, flag);
```

```
                    if (flag) {
                            status = (*search_callback)
                                    (&(bptr->dataptr[k]),
                                    &(bptr->dataptr[k]),
                                            user_data);

switch (status) {
                        case TWOD$_DELNOD:
                                twod$delete_geom ( user_context, &data );
                            break;
                        case TWOD$_OPEABO:
                                return TWOD$_OPEABO;
                            break;
                        case TWOD$_DELABO:
                                twod$delete_geom ( user_context, &data );
                                return TWOD$_OPEABO;
                            break;
                        default:
                            STOP_NOT_SUCCESS(status);
                        }
                            }
                        }
                        k++;
                        }
                    }

} else {
                    status = find_intersecting_data(sptr->ss_sb_buckets + j,
                                    key,*search_type,
                                search_callback,user_data,
                                    bc,user_context);
                    if ( status == TWOD$_DELABO || status == TWOD$_OPEABO)
                        return TWOD$_OPEABO;
                }
            }
        }
    }
}

/*
*** search the stripes that have orientation orthogonal to the search window
*/
mesh_levels = (!X_OR_Y(key) ? bc->x_mesh_levels: bc->y_mesh_levels);
for ( h = 0; h < mesh_levels; h++) {
    mptr = (!X_OR_Y(key) ? bc->x_mesh : bc->y_mesh) + h;
    lo_stripe = WL_LO_STRIPE(mptr, key, bc);
    hi_stripe = WL_HI_STRIPE(mptr, key, bc);
    lo_bucket = WL_LO_BUCKET(key, mptr);
    hi_bucket = WL_HI_BUCKET(key, mptr);
    for( i = lo_stripe;
        i <= hi_stripe;
        i++) {
        sptr = mptr->stripe + i;

if ( i == lo_stripe ) {
        /* search buckets in lowest stripe */
            for( j = lo_bucket;
```

```
                    j <= hi_bucket;
                    j++ ) {
                    if ( j == lo_bucket ) {
                        status = find_intersecting_data(sptr->ss_sb_buckets + j,
                                        key,*search_type,
                                    search_callback,user_data,
                                            bc,user_context);
                        if ( status == TWOD$_DELABO || status == TWOD$_OPEABO)
                            return TWOD$_OPEABO;
                        status = find_intersecting_data(sptr->xs_sb_buckets + j,
                                        key,*search_type,
                                    search_callback,user_data,
                                            bc,user_context);
                        if ( status == TWOD$_DELABO || status == TWOD$_OPEABO)
                            return TWOD$_OPEABO;
                        status = find_intersecting_data(sptr->ss_xb_buckets + j,
                                        key,*search_type,
                                    search_callback,user_data,
                                            bc,user_context);
                        if ( status == TWOD$_DELABO || status == TWOD$_OPEABO)
                            return TWOD$_OPEABO;
                        status = find_intersecting_data(sptr->xs_xb_buckets + j,
                                        key,*search_type,
                                    search_callback,user_data,
                                            bc,user_context);
                    } else {
                        status = find_intersecting_data(sptr->ss_sb_buckets + j,
                                        key,*search_type,
                                    search_callback,user_data,
                                            bc,user_context);
                        if ( status == TWOD$_DELABO || status == TWOD$_OPEABO)
                            return TWOD$_OPEABO;
                        status = find_intersecting_data(sptr->xs_sb_buckets + j,
                                        key,*search_type,
                                    search_callback,user_data,
                                            bc,user_context);
                        if ( status == TWOD$_DELABO || status == TWOD$_OPEABO)
                            return TWOD$_OPEABO;
                    }
                }
            } else {
                /* search buckets in all stripes except the lowest stripe */
                for( j = lo_bucket;
                    j <= hi_bucket;
                    j++ ) {
                    if ( j == lo_bucket ) {
                        status = find_intersecting_data(sptr->ss_sb_buckets + j,
                                        key,*search_type,
                                    search_callback,user_data,
                                            bc,user_context);
                        if ( status == TWOD$_DELABO || status == TWOD$_OPEABO)
                            return TWOD$_OPEABO;
                        status = find_intersecting_data(sptr->ss_xb_buckets + j,
                                        key,*search_type,
                                    search_callback,user_data,
                                            bc,user_context);
```

```
            if ( status == TWOD$_DELABO || status == TWOD$_OPEABO)
                return TWOD$_OPEABO;
       } else if ((j < hi_bucket) &&
                (i < hi_stripe)) {
            for (bptr = sptr->ss_sb_buckets[j];
                bptr != NULL; bptr = nbptr) {
                nbptr = bptr->next;
                k = 0;
                obj_count = 0;
                obj_total = bptr->data_count;
                while(obj_count < obj_total) {
                    if(k >= bc->bucket_size) break;
                      if( (data = bptr->dataptr[k]) != 0 ) {
                        obj_count++;
                      data_key = OFFSET(bc, data);
                    FILTER_SEARCH_OBJECT(*search_type, data_key,
                                key, flag);
                    if (flag) {
                            status = (*search_callback)
                                (&(bptr->dataptr[k]),
                                 &(bptr->dataptr[k]),
                                            user_data);

switch (status) {
                    case TWOD$_DELNOD:
                                twod$delete_geom ( user_context, &data );
                        break;
                    case TWOD$_OPEABO:
                                return TWOD$_OPEABO;
                        break;
                    case TWOD$_DELABO:
                                twod$delete_geom ( user_context, &data );
                                return TWOD$_OPEABO;
                        break;
                    default:
                        STOP_NOT_SUCCESS(status);
                    }
                        }
                    }
                    k++;
                }
            }

} else {
            status = find_intersecting_data(sptr->ss_sb_buckets + j,
                            key,*search_type,
                        search_callback,user_data,bc,
                                user_context);
            if ( status == TWOD$_DELABO || status == TWOD$_OPEABO)
                return TWOD$_OPEABO;
        }
      }
     }
    }
} return SS$_NORMAL;
```

}

```
PUBLIC int twod$traverse_geom(
    int         *user_context,
    int         (*traverse_callback)(),
    int         user_data)
{

BUCKET_CONTEXT      *bc = BC(user_context);
    MESH                *mptr;
    STRIPE              *sptr;
    BUCKET              *bptr, *fbptr, *nbptr;
    int                 h,i,j,k,flag,bkt_del_flag,status;
    char                *data;
    int                 *data_key;
    int                 obj_count,obj_total;

if( bc->data_count == 0 ) {
        return SS$_NORMAL;
    }

/*
    ** traverse stripes that have same orientation as the search window
    */
    for( h = 0; h < bc->x_mesh_levels; h++) {
        mptr = bc->x_mesh + h;
        for ( i = 0; i < mptr->num_stripes; i++) {
            sptr = mptr->stripe + i;
            for ( j = 0; j < mptr->buckets_per_stripe; j++ ) {
                fbptr = sptr->ss_sb_buckets[j];
                if ( fbptr == NULL ) continue;
                for (bptr = fbptr; bptr != NULL; bptr = nbptr) {
                    nbptr = bptr->next;
                    k = 0;
                    obj_count = 0;
                    obj_total = bptr->data_count;
                    while(obj_count < obj_total) {
                        if(k >= bc->bucket_size) break;
                        if( (data = bptr->dataptr[k]) != 0 ) {
                            obj_count++;
                            status = (*traverse_callback)(&(bptr->dataptr[k]),
                                            &(bptr->dataptr[k]),
                                                        user_data);
                            switch (status) {
                            case TWOD$_DELNOD:
                                    twod$delete_geom ( user_context, &data );
                                break;
                            case TWOD$_OPEABO:
                                    return TWOD$_OPEABO;
                                break;
                            case TWOD$_DELABO:
                                    twod$delete_geom ( user_context, &data );
                                    return TWOD$_OPEABO;
```

```
                    break;
                default:
                    STOP_NOT_SUCCESS(status);
                }
            }
            k++;
        }
      }
     }
    }
   }
}

/*
** traverse stripes that have orthogonal orientation as the search window
*/
for( h = 0; h < bc->y_mesh_levels; h++) {
    mptr = bc->y_mesh + h;
    for ( i = 0; i < mptr->num_stripes; i++) {
        sptr = mptr->stripe + i;
        for ( j = 0; j < raptr->buckets_per_stripe; j++ ) {
            fbptr = sptr->ss_sb_buckets[j];

if ( fbptr == NULL ) continue;
            for (bptr = fbptr; bptr != NULL; bptr = nbptr) {
                nbptr = bptr->next;
                k = 0;
                obj_count = 0;
                obj_total = bptr->data_count;
                while(obj_count < obj_total) {
                    if(k >= bc->bucket_size) break;
                    if( (data = bptr->dataptr[k]) != 0 ) {
                        obj_count++;
                        status = (*traverse_callback)(&(bptr->dataptr[k]),
                                        &(bptr->dataptr[k]),
                                                    user_data);
                        switch (status) {
                        case TWOD$_DELNOD:
                            twod$delete_geom ( user_context, &data );
                          break;
                        case TWOD$_OPEABO:
                            return TWOD$_OPEABO;
                          break;
                        case TWOD$_DELABO:
                            twod$delete_geom ( user_context, &data );
                            return TWOD$_OPEABO;
                          break;
                        default:
                            STOP_NOT_SUCCESS(status);
                        }
                    }
                    k++;
                }
            }
        }
    }
}
```

```
/*
** If there are empty buckets in this list, return them to VM
*/
release_free_buckets ( bc );

return SS$_NORMAL;
}

PUBLIC int icbm_get_stats(
    int         *user_context,
    int         *hier_ratio,
    int         *max_mesh_levels,
    int         *smallest_stripe_width,
    int         *bucket_span,
    int         *bucket_size,
    int         *num_objects,
    int         *num_stored)
{
/****
    BUCKET_CONTEXT      *bc = BC(user_context);
    *hier_ratio = bc->hier_ratio;
    *max_mesh_levels = bc->max_mesh_levels;
    *smallest_stripe_width = bc->smallest_stripe_width;
    *bucket_span = bc->bucket_span;
    *bucket_size = bc->bucket_size;
    *num_objects = bc->data_count;
    *num_stored = bc->elem_count;
****/
    return SS$_NORMAL;
}

PUBLIC int twod$get_geom_size(
    int         *user_context,
    int         *geom_count)
{
    BUCKET_CONTEXT      *bc = BC(user_context);
    *geom_count = bc->data_count;

return SS$_NORMAL;
}

PUBLIC int twod$get_geom_mbb(
    int         *user_context,
    int         *mbb)

{
    BUCKET_CONTEXT      *bc = BC(user_context);

if( bc->data_count == 0 ) {

LLX(mbb) = 0;
        LLY(mbb) = 0;
        URX(mbb) = 0;
        URY(mbb) = 0;

return SS$_NORMAL;
```

```
}

LLX(mbb) = INFINITY;
    LLY(mbb) = INFINITY;
    URX(mbb) = -INFINITY;
    URY(mbb) = -INFINITY;

calculate_xmesh_mbb(user_context, mbb);  /* calculate for xmesh */
    calculate_ymesh_mbb(user_context, mbb);  /* calculate for ymesh */ return SS$_NORMAL;
}
PUBLIC int icbm_optimize(
    int         *user_context,
    int         hier_ratio,
    int         max_mesh_levels,
    int         bucket_size)
{
    BUCKET_CONTEXT      *bc = BC(user_context),
                        *nbc;
    MESH                *mptr;
    STRIPE              *sptr;
    BUCKET              *bptr, *fbptr;
    char                *data;
    int                 *data_key;
    int                 h,i,j,k;
    int                 *junk;
    int                 llx = INFINITY,
                        lly = INFINITY,
                        urx = -INFINITY,
                        ury = -INFINITY;

bc->insert_count = 0;

/* find out the MBB extreme extents in x and y of all the data */

/* first for x stripes */ for( h = 0; h < bc->x_mesh_levels; h++) {
        mptr = bc->x_mesh + h;
        for( i = 0; i < mptr->num_stripes; i++) {
            sptr = mptr->stripe + i;
            for( j = 0; j < mptr->buckets_per_stripe; j++) {
                fbptr = sptr->ss_sb_buckets[j];
                if ( fbptr == NULL ) continue;
                for (bptr = fbptr; bptr != NULL; bptr = bptr->next)
                for( k = 0; k < bc->bucket_size; k++) {
                    if( (data = bptr->dataptr[k]) != 0 ) {
                        data_key = OFFSET(bc, data);
                        llx = MIN2(llx, LLX(data_key));
                        urx = MAX2(urx, URX(data_key));
                        lly = MIN2(lly, LLY(data_key));
                        ury = MAX2(ury, URY(data_key));
                    }
                }
            }
```

```
            }
          }
        }

/* then for y stripes */ for( h = 0; h < bc->y_mesh_levels; h++) {
        mptr = bc->y_mesh + h;

for( i = 0; i < mptr->num_stripes; i++) {
          sptr = mptr->stripe + i;
          for( j = 0; j < mptr->buckets_per_stripe; j++) {
              fbptr = sptr->ss_sb_buckets[j];
              if ( fbptr == NULL ) continue;
              for (bptr = fbptr; bptr != NULL; bptr = bptr->next)
              for( k = 0; k < bc->bucket_size; k++) {
                  if( (data = bptr->dataptr[k]) != 0 ) {
                      data_key = OFFSET(bc, data);
                      llx = MIN2(llx, LLX(data_key));
                      urx = MAX2(urx, URX(data_key));
                      lly = MIN2(lly, LLY(data_key));
                      ury = MAX2(ury, URY(data_key));
                  }
              }
          }
      }
    }
}

/* increment urx, ury by 1 since array[0..urx] is from 0 to (urx-1) */ urx++;
ury++;

/*   create new bucket context and attach it to the user context */ nbc = (BUCKET_CONTEXT *) calloc(1, sizeof(BUCKET_CONTEXT));
BC(user_context) = nbc;
CREATE_ZONE(nbc->vm_zone);

nbc->mbb_offset = bc->mbb_offset; /* retain the offset */
nbc->hier_ratio = hier_ratio;
nbc->max_mesh_levels = max_mesh_levels;
nbc->bucket_size = bucket_size;

/*
 * Transfer parameters
 */
nbc->bucket_size = bc->bucket_size;
nbc->max_objects_in_bucket = bc->max_objects_in_bucket;
nbc->l_to_w_ratio = bc->l_to_w_ratio;

nbc->llx = llx;
nbc->lly = lly;
nbc->urx = urx;
nbc->ury = ury;

get_new_bucket_dims(nbc, llx, lly, urx, ury, bc->data_count); /* dynamically recompute the sizes */
```

```
    compute_and_allocate_stripes(nbc);

/* transfer all data to new bucket_context */ for( h = 0; h < bc->x_mesh_levels; h++) {
        mptr = bc->x_mesh + h;
        for( i = 0; i < mptr->num_stripes; i++) {
            sptr = mptr->stripe + i;
            for( j = 0; j < mptr->buckets_per_stripe; j++) {
                fbptr = sptr->ss_sb_buckets[j];
                if ( fbptr == NULL ) continue;
                for (bptr = fbptr; bptr != NULL; bptr = bptr->next)
                    for( k = 0; k < bc->bucket_size; k++) {
                        if( (data = bptr->dataptr[k]) != 0 ) {
                            twod$insert_geom(user_context, &0,
                                        &(bptr->dataptr[k]), &junk);
                        }
                    }
            }
        }
    } for( h = 0; h < bc->y_mesh_levels; h++) {
        mptr = bc->y_mesh + h;
        for( i = 0; i < mptr->num_stripes; i++) {
            sptr = mptr->stripe + i;
            for( j = 0; j < mptr->buckets_per_stripe; j++) {
                fbptr = sptr->ss_sb_buckets[j];
                if ( fbptr == NULL ) continue;
                for (bptr = fbptr; bptr != NULL; bptr = bptr->next)
                    for( k = 0; k < bc->bucket_size; k++) {
                        if( (data = bptr->dataptr[k]) != 0 ) {
                            twod$insert_geom(user_context, &0,
                                        &(bptr->dataptr[k]), &junk);
                        }
                    }
            }
        }
    } icbm_delete_bucket_context( bc );
    nbc->optimized = TRUE;
    nbc->insert_count = 0;
    return SS$_NORMAL;
}

PRIVATE icbm_delete_bucket_context(
    BUCKET_CONTEXT      *bc)
{

FREE_ZONE(bc->vm_zone);
    DISPOSE(bc);

return SS$_NORMAL;
}
/*
** given a bucket list, insert a data into that list
```

```
** If necessary, allocate a new bucket.
*/

PRIVATE insert_data(
    BUCKET      **bucket_list,
    char        **dataptr,
    BUCKET_CONTEXT *bc)
{
    BUCKET *cur_bucket_ptr;
        for( cur_bucket_ptr = *bucket_list; cur_bucket_ptr != NULL;
            cur_bucket_ptr = cur_bucket_ptr->next) {
            if(cur_bucket_ptr->first_hole != ICBM_K_END_HOLE) {
                cur_bucket_ptr->dataptr[cur_bucket_ptr->first_hole]=
                    (*dataptr);
                cur_bucket_ptr->data_count++;
                NEXT_HOLE(cur_bucket_ptr, bc);
                break;
            }
        }
        if( cur_bucket_ptr == NULL ) { /* allocate a new bucket */
            NEW_BUCKET(cur_bucket_ptr, bc);
            ADD_BUCKET(*bucket_list, cur_bucket_ptr);
            cur_bucket_ptr->dataptr[0] = (*dataptr);
            NEXT_HOLE(cur_bucket_ptr, bc);
            cur_bucket_ptr->data_count++;
        }
        bc->elem_count++;
    return SS$_NORMAL;
}

/*
** remove a data element from the bucket_list.
** If a bucket becomes empty, put it on the free_bucket_list
*/

PRIVATE delete_data(
    BUCKET      **bucket_list,
    char        **dataptr,
    BUCKET_CONTEXT *bc)
{
    BUCKET      *cur_bucket_ptr;
    int         i, done = FALSE;

for( cur_bucket_ptr = *bucket_list; cur_bucket_ptr != NULL;
            cur_bucket_ptr = cur_bucket_ptr->next) {
            for ( i = 0; i < bc->bucket_size; i++) {
                if(cur_bucket_ptr->dataptr[i] == (*dataptr)) {
                    cur_bucket_ptr->dataptr[i] = 0;
                    cur_bucket_ptr->data_count--;
                    if ( cur_bucket_ptr->first_hole > i )
                        cur_bucket_ptr->first_hole = i;
                    done = TRUE;
                    break;
                }
            }
            if (done) break;
```

```
          }
          if( cur_bucket_ptr == NULL ) {
              printf("\nData not found in the bucket!\n");
          } else if( cur_bucket_ptr->data_count == 0 ) {
              add_free_buckets(bucket_list, cur_bucket_ptr, bc);
              bc->elem_count--;
              return TRUE;
          }
          bc->elem_count--;
    return FALSE;
}

PRIVATE add_free_buckets(
    BUCKET         **blist,
    BUCKET         *bptr,
    BUCKET_CONTEXT *bc)
{
    BUCKET *cptr, *pptr;

pptr = NULL;

for( cptr = *blist; cptr != NULL;
         pptr = cptr, cptr = cptr->next) {
        if( cptr == bptr )
            break;
    } if( cptr == NULL ) {
        STOP_NOT_SUCCESS(0);
    } if( pptr == NULL ) {
        *blist = bptr->next;
    } else {
        pptr->next = bptr->next;
    } bptr->next = bc->free_bkt_list;
    bc->free_bkt_list = bptr;
    return SS$_NORMAL;
}

PRIVATE release_free_buckets ( BUCKET_CONTEXT *bc )
{
    BUCKET *tptr, *bptr;
    for ( bptr = bc->free_bkt_list; bptr != NULL; bptr= tptr) {
        tptr = bptr->next;
        FREE_BUCKET(bptr, bc);
    }
    bc->free_bkt_list = NULL;
    return SS$_NORMAL;
}

/*
** Not used through the TWOD interface. Purpose of the routine is obvious
*/
```

```
PUBLIC icbm_output_statistics(
        int             *user_context,
        FILE            *fp)
{
    BUCKET_CONTEXT      *bc = BC(user_context);

/*
    ** first, find out the total number of data elements in buckets
    */
/************
    fprintf(fp, "\nX stripe array size: %d", bc->x_num_stripes);
    fprintf(fp, "\nY stripe array size: %d", bc->y_num_stripes);
    fprintf(fp, "\n bucket lists per X stripe: %d", bc->x_buckets_per_stripe);
    fprintf(fp, "\n bucket lists per Y stripe: %d", bc->y_buckets_per_stripe);
    fprintf(fp, "\n number of data elements per bucket: %d", bc->bucket_size);

fprintf(fp, "\n total data count: %d", bc->data_count);
    fprintf(fp, "\n total elem count: %d", bc->elem_count);
    fprintf(fp, "\n total bucket count: %d", bc->bucket_count);
************/
    return SS$_NORMAL;
}

/*
** For a given bucket_context, allocate memory for the meshes and stripes,
** given the extent of the user defined area (stored in llx,lly,urx,ury field
** of bc)
*/

PRIVATE compute_and_allocate_stripes(
    BUCKET_CONTEXT *bc )
{
    int     i,j,k;
    MESH    *mptr;
    STRIPE  *sptr;
    BUCKET  *bptr;

/*
    ** allocate the array of meshes
    */
    {
        for( i = bc->smallest_stripe_width, k = 0;

(i < X_IN(bc->urx,bc)) && (k < bc->max_mesh_levels);
            i = i * bc->hier_ratio , k++) {
        }
        bc->y_mesh_levels = MIN2(bc->max_mesh_levels, k + 1);

for( i = bc->smallest_stripe_width, k = 0;
            (i < Y_IN(bc->ury,bc)) && (k < bc->max_mesh_levels);
            i = i * bc->hier_ratio , k++) {
        }
        bc->x_mesh_levels = MIN2(bc->max_mesh_levels, k + 1);

NEWZARRAY(bc->x_mesh_levels, bc->x_mesh, bc->vm_zone);
        NEWZARRAY(bc->y_mesh_levels, bc->y_mesh, bc->vm_zone);
    }
```

```c
/*
** allocate stripe arrays for each mesh level
** Determine width and length of buckets for each level
** Maintain w to l ratio to be the same in each level
*/
{
    for ( i = bc->smallest_stripe_width, k = 0;
        k < bc->x_mesh_levels;
        i = i * bc->hier_ratio, k++) {
     mptr = bc->x_mesh + k;
     mptr->stripe_width = i;
     mptr->bucket_span = i * bc->l_to_w_ratio;
     mptr->buckets_per_stripe = (X_IN(bc->urx, bc)/mptr->bucket_span) + 1;
     mptr->num_stripes = (Y_IN(bc->ury, bc)/i) + 1;
     NEWZARRAY(mptr->num_stripes, mptr->stripe, bc->vm_zone);
    } for ( i = bc->smallest_stripe_width, k = 0;
        k < bc->y_mesh_levels;
        i = i * bc->hier_ratio, k++) {
     mptr = bc->y_mesh + k;
     mptr->stripe_width = i;
     mptr->bucket_span = i * bc->l_to_w_ratio;
     mptr->buckets_per_stripe = (Y_IN(bc->ury, bc)/mptr->bucket_span) +
                                                                      1;
     mptr->num_stripes = (X_IN(bc->urx, bc)/i) + 1;
     NEWZARRAY(mptr->num_stripes, mptr->stripe, bc->vm_zone);
    }
}

/*
** Allocate memory for bucket ptrs in stripes
*/
for ( i = 0; i < bc->x_mesh_levels; i++ ) {
    mptr = bc->x_mesh + i;
    for( j = 0; j < mptr->num_stripes; j++) {
     sptr = mptr->stripe + j;

NEWZARRAY(mptr->buckets_per_stripe,sptr->ss_sb_buckets,bc->vm_zone);
        NEWZARRAY(mptr->buckets_per_stripe,sptr->ss_xb_buckets,bc->vm_zone);
        NEWZARRAY(mptr->buckets_per_stripe,sptr->xs_sb_buckets,bc->vm_zone);
        NEWZARRAY(mptr->buckets_per_stripe,sptr->xs_xb_buckets,bc->vm_zone);
    }
} for ( 1 = 0; i < bc->y_mesh_levels; i++ ) {
    mptr = bc->y_mesh + i;
    for( j = 0; j < mptr->num_stripes; j++) {
     sptr = mptr->stripe + j;
     NEWZARRAY(mptr->buckets_per_stripe,sptr->ss_sb_buckets,bc->vm_zone);
     NEWZARRAY(mptr->buckets_per_stripe,sptr->ss_xb_buckets,bc->vm_zone);
     NEWZARRAY(mptr->buckets_per_stripe,sptr->xs_sb_buckets,bc->vm_zone);
     NEWZARRAY(mptr->buckets_per_stripe,sptr->xs_xb_buckets,bc->vm_zone);
    }
}
}
```

```
/*
** For a given bucket_context, calculate the mbb of the horizontal mesh.
*/

PRIVATE int calculate_xmesh_mbb(
    int         *user_context,
    int         *mbb)
{
    BUCKET_CONTEXT      *bc = BC(user_context);
    MESH                *mptr;
    STRIPE              *sptr;
    BUCKET              *bptr, *fbptr, *nbptr;
    int                 h,i,j,k,flag,bkt_del_flag,status;
    char                *data;
    int                 *data_key;
    int                 lo_stripe, hi_stripe;
    int                 lo_bucket, hi_bucket;
    int                 data_found = FALSE;

for( h = 0; h < bc->x_mesh_levels; h++) { mptr = bc->x_mesh + h;

if (h > 0)
          data_found = ((lo_stripe != -1) ? TRUE : data_found) ;

lo_stripe = -1;
        hi_stripe = -1;
        lo_bucket = -1;
        hi_bucket = -1;

/*
        ** traverse stripes from bottom to find LLY of MBB
        */ for ( i = 0; (i < mptr->num_stripes) && (lo_stripe == -1); i++) {
          sptr = mptr->stripe + i;
          for ( j = 0; j < mptr->buckets_per_stripe; j++ ) {
              fbptr = sptr->ss_sb_buckets[j];
              if ( fbptr == NULL ) continue;
              for (bptr = fbptr; bptr != NULL; bptr = nbptr) {
                  nbptr = bptr->next;
              if (bptr->data_count == 0) continue;
              lo_stripe = i;
                  for ( k = 0; k < bc->bucket_size; k++ ) {
                      if( (data = bptr->dataptr[k]) != 0 ) {
                      data_key = OFFSET(bc, data);
                      LLX(mbb) = MIN2(LLX(mbb), LLX(data_key));
                      LLY(mbb) = MIN2(LLY(mbb), LLY(data_key));
                      URX(mbb) = MAX2(URX(mbb), URX(data_key));
                      URY(mbb) = MAX2(URY(mbb), URY(data_key));
                      }
                  }
              }
          }
        }
    }
}
```

```
/*
** if lowest stripe was not found then no data is present in mesh
*/
if (lo_stripe == -1) continue;

/*
** traverse stripes from TOP to find URY of MBB
*/
    for ( i = mptr->num_stripes-1; (i >= lo_stripe) && (hi_stripe == -1); i--) {
        sptr = mptr->stripe + i;
        for ( j = 0; j < mptr->buckets_per_stripe; j++ ) {
            /*
            ** look in ss_sb
            */
                fbptr = sptr->ss_sb_buckets[j];
                if ( fbptr != NULL ) {
                    for (bptr = fbptr; bptr != NULL; bptr = nbptr) {
                        nbptr = bptr->next;
                    if (bptr->data_count == 0) continue;
                    hi_stripe = i;
                        for ( k = 0; k < bc->bucket_size; k++ ) {
                            if( (data = bptr->dataptr[k]) != 0 ) {
                            data_key = OFFSET(bc, data);
                            LLX(mbb) = MIN2(LLX(mbb), LLX(data_key));
                            URX(mbb) = MAX2(URX(mbb), URX(data_key));
                            URY(mbb) = MAX2(URY(mbb), URY(data_key));
                            }
                        }
                    }
                }
        }
        /*
        ** look in xs_sb
        */
                fbptr = sptr->xs_sb_buckets[j];
                if ( fbptr == NULL ) continue;
                for (bptr = fbptr; bptr != NULL; bptr = nbptr) {
                    nbptr = bptr->next;
                if (bptr->data_count == 0) continue;
                hi_stripe = i;
                    for ( k = 0; k < bc->bucket_size; k++ ) {
                        if( (data = bptr->dataptr[k]) != 0 ) {
                        data_key = OFFSET(bc, data);
                        LLX(mbb) = MIN2(LLX(mbb), LLX(data_key));
                        URX(mbb) = MAX2(URX(mbb), URX(data_key));
                        URY(mbb) = MAX2(URY(mbb), URY(data_key));
                        }
                    }
                }
            }
        }
    }

/*
** traverse stripes to find LLX of MBB
*/ for ( j = 0; (j < mptr->buckets_per_stripe) && (lo_bucket == -1); j++ ) {
```

```
for ( i = lo_stripe; i <= hi_stripe; i++) {
    sptr = mptr->stripe + i;
    fbptr = sptr->ss_sb_buckets[j];
    if ( fbptr == NULL ) continue;
    for (bptr = fbptr; bptr != NULL; bptr = nbptr) {
        nbptr = bptr->next;
        if (bptr->data_count == 0) continue;
        lo_bucket = j;
        for ( k = 0; k < bc->bucket_size; k++ ) {
            if( (data = bptr->dataptr[k]) != 0 ) {
                data_key = OFFSET(bc, data);
                LLX(mbb) = MIN2(LLX(mbb), LLX(data_key));
                URX(mbb) = MAX2(URX(mbb), URX(data_key));
            }
        }
    }
}

/*
** traverse stripes to find URX of MBB
*/
for ( j = mptr->buckets_per_stripe-1; j > 0 && (hi_bucket == -1); j-- ) {
    for ( i = lo_stripe; i <= hi_stripe; i++) { sptr = mptr->stripe + i;
        fbptr = sptr->ss_sb_buckets[j];
        if ( fbptr != NULL ) {
            for (bptr = fbptr; bptr != NULL; bptr = nbptr) {
                nbptr = bptr->next;
                if (bptr->data_count == 0) continue;
                hi_bucket = j;
                for ( k = 0; k < bc->bucket_size; k++ ) {
                    if( (data = bptr->dataptr[k]) != 0 ) {
                        data_key = OFFSET(bc, data);
                        URX(mbb) = MAX2(URX(mbb), URX(data_key));
                    }
                }
            }
        }
        /*
        ** look in xs_sb
        */
        fbptr = sptr->xs_sb_buckets[j];
        if ( fbptr != NULL ) {
            for (bptr = fbptr; bptr != NULL; bptr = nbptr) {
                nbptr = bptr->next;
                if (bptr->data_count == 0) continue;
                hi_bucket = j;
                for ( k = 0; k < bc->bucket_size; k++ ) {
                    if( (data = bptr->dataptr[k]) != 0 ) {
                        data_key = OFFSET(bc, data);
                        URX(mbb) = MAX2(URX(mbb), URX(data_key));
                    }
                }
            }
        }
```

```
            /*
            ** look in ss_xb
            */
                fbptr = sptr->ss_xb_buckets[j];
                if ( fbptr != NULL ) {
                    for (bptr = fbptr; bptr != NULL; bptr = nbptr) {
                        nbptr = bptr->next;
                    if (bptr->data_count == 0) continue;
                    hi_bucket = j;
                        for ( k = 0; k < bc->bucket_size; k++ ) {
                            if( (data = bptr->dataptr[k]) != 0 ) {
                            data_key = OFFSET(bc, data);
                            URX(mbb) = MAX2(URX(mbb), URX(data_key));
                                }
                            }
                        }
                    }
            /*
            ** look in xs_xb
            */
                fbptr = sptr->xs_xb_buckets[j];
                if ( fbptr == NULL ) continue;
                for (bptr = fbptr; bptr != NULL; bptr = nbptr) {
                    nbptr = bptr->next;
                if (bptr->data_count == 0) continue;
                hi_bucket = j;
                    for ( k = 0; k < bc->bucket_size; k++ ) {
                        if( (data = bptr->dataptr[k]) != 0 ) {
                        data_key = OFFSET(bc, data);
                        URX(mbb) = MAX2(URX(mbb), URX(data_key));
                            }
                        }
                    }
                }
            }
        }
}

/*
** For a given bucket_context, calculate the mbb of the vertical mesh.
*/

PRIVATE int calculate_ymesh_mbb(
    int         *user_context,
    int         *mbb)
{
    BUCKET_CONTEXT      *bc = BC(user_context);
    MESH                *mptr;
    STRIPE              *sptr;
    BUCKET              *bptr, *fbptr, *nbptr;
    int                 h,i,j,k,flag,bkt_del_flag,status;
    char                *data;
    int                 *data_key;
    int                 lo_stripe, hi_stripe;
    int                 lo_bucket, hi_bucket;
    int                 data_found = FALSE;
```

```
for( h = 0; h < bc->y_mesh_levels; h++) { mptr = bc->y_mesh + h;

if (h > 0)
        data_found = ((lo_stripe != -1) ? TRUE : data_found) ;

lo_stripe = -1;
    hi_stripe = -1;
    lo_bucket = -1;
    hi_bucket = -1;

/*
    ** traverse stripes from left to find LLX of MBB
    */ for ( i = 0; (i < mptr->num_stripes) && (lo_stripe == -1); i++) {
        sptr = mptr->stripe + i;
        for ( j = 0; j < mptr->buckets_per_stripe; j++ ) {
            fbptr = sptr->ss_sb_buckets[j];
            if ( fbptr == NULL ) continue;
            for (bptr = fbptr; bptr != NULL; bptr = nbptr) {
                nbptr = bptr->next;
            if (bptr->data_count == 0) continue;
            lo_stripe = i;
                for ( k = 0; k < bc->bucket_size; k++ ) {
                    if( (data = bptr->dataptr[k]) != 0 ) {
                    data_key = OFFSET(bc, data);
                    LLX(mbb) = MIN2(LLX(mbb), LLX(data_key));
                    LLY(mbb) = MIN2(LLY(mbb), LLY(data_key));
                    URX(mbb) = MAX2(URX(mbb), URX(data_key));
                    URY(mbb) = MAX2(URY(mbb), URY(data_key));
                    }
                }
            }
        }
    }

/*
** if lowest stripe was not found then no data is present in mesh
*/
if (lo_stripe == -1) continue;

/*
** traverse stripes from RIGHT to find URX of MBB
*/
    for ( i = mptr->num_stripes-1; (i >= lo_stripe) && (hi_stripe == -1); i--) {
        sptr = mptr->stripe + i;
        for ( j = 0; j < mptr->buckets_per_stripe; j++ ) {
            /*
            ** look in ss_sb
            */
            fbptr = sptr->ss_sb_buckets[j];
            if ( fbptr != NULL ) {
                for (bptr = fbptr; bptr != NULL; bptr = nbptr) {
                    nbptr = bptr->next;
```

```
            if (bptr->data_count == 0) continue;
        hi_stripe = i;
            for ( k = 0; k < bc->bucket_size; k++ ) {
                if( (data = bptr->dataptr[k]) != 0 ) {
                data_key = OFFSET(bc, data);
                URX(mbb) = MAX2(URX(mbb), URX(data_key));
                LLY(mbb) = MIN2(LLY(mbb), LLY(data_key));
                URY(mbb) = MAX2(URY(mbb), URY(data_key));
                 }
            }
            }
        }
        /*
        ** look in xs_sb
        */
            fbptr = sptr->xs_sb_buckets[j];
            if ( fbptr == NULL ) continue;
            for (bptr = fbptr; bptr != NULL; bptr = nbptr) {
                nbptr = bptr->next;
            if (bptr->data_count == 0) continue;
        hi_stripe = i;
            for ( k = 0; k < bc->bucket_size; k++ ) {
                if( (data = bptr->dataptr[k]) != 0 ) {
                data_key = OFFSET(bc, data);
                URX(mbb) = MAX2(URX(mbb), URX(data_key));
                LLY(mbb) = MIN2(LLY(mbb), LLY(data_key));
                URY(mbb) = MAX2(URY(mbb), URY(data_key));
                 }
            }
            }
        }
    }

/*
    ** traverse stripes to find LLY of MBB
    */ for ( j = 0; (j < mptr->buckets_per_stripe) && (lo_bucket == -1); j++ ) {
        for ( i = lo_stripe; i <= hi_stripe; i++) {
            sptr = mptr->stripe + i;
            fbptr = sptr->ss_sb_buckets[j];
            if ( fbptr == NULL ) continue;
            for (bptr = fbptr; bptr != NULL; bptr = nbptr) {
                nbptr = bptr->next;
            if (bptr->data_count == 0) continue;
        lo_bucket = j;
            for ( k = 0; k < bc->bucket_size; k++ ) {
                if( (data = bptr->dataptr[k]) != 0 ) {
                data_key = OFFSET(bc, data);
                LLY(mbb) = MIN2(LLY(mbb), LLY(data_key));
                URY(mbb) = MAX2(URY(mbb), URY(data_key));
                 }
            }
            }
        }
    }
```

```
/*
** traverse stripes to find URY of MBB
*/
for ( j = mptr->buckets_per_stripe-1; j > 0 && (hi_bucket == -1); j-- ) {
    for ( i = lo_stripe; i <= hi_stripe; i++ ) {
        sptr = mptr->stripe + i;
        fbptr = sptr->ss_sb_buckets[j];
        if ( fbptr != NULL ) {
            for (bptr = fbptr; bptr != NULL; bptr = nbptr) {
                nbptr = bptr->next;
                if (bptr->data_count == 0) continue;
                hi_bucket = j;
                for ( k = 0; k < bc->bucket_size; k++ ) {
                    if( (data = bptr->dataptr[k]) != 0 ) {
                        data_key = OFFSET(bc, data);
                        URY(mbb) = MAX2(URY(mbb), URY(data_key));
                    }
                }
            }
        }
/*
** look in xs_sb
*/
        fbptr = sptr->xs_sb_buckets[j];
        if ( fbptr != NULL ) {
            for (bptr = fbptr; bptr != NULL; bptr = nbptr) {
                nbptr = bptr->next;
                if (bptr->data_count == 0) continue;
                hi_bucket = j;
                for ( k = 0; k < bc->bucket_size; k++ ) {
                    if( (data = bptr->dataptr[k]) != 0 ) {
                        data_key = OFFSET(bc, data);
                        URY(mbb) = MAX2(URY(mbb), URY(data_key));
                    }
                }
            }
        }
/*
** look in ss_xb
*/
        fbptr = sptr->ss_xb_buckets[j];
        if ( fbptr != NULL ) {
            for (bptr = fbptr; bptr != NULL; bptr = nbptr) {
                nbptr = bptr->next;
                if (bptr->data_count == 0) continue;
                hi_bucket = j;
                for ( k = 0; k < bc->bucket_size; k++ ) {
                    if( (data = bptr->dataptr[k]) != 0 ) {
                        data_key = OFFSET(bc, data);
                        URY(mbb) = MAX2(URY(mbb), URY(data_key));
                    }
                }
            }
        }
/*
** look in xs_xb
*/
```

```c
            fbptr = sptr->xs_xb_buckets[j];
            if ( fbptr == NULL ) continue;
            for (bptr = fbptr; bptr != NULL; bptr = nbptr) {
                nbptr = bptr->next;
            if (bptr->data_count == 0) continue;
            hi_bucket = j;
                for ( k = 0; k < bc->bucket_size; k++ ) {
                    if( (data = bptr->dataptr[k]) != 0 ) {
                    data_key = OFFSET(bc, data);
                    URY(mbb) = MAX2(URY(mbb), URY(data_key));
                    }
                }
            }
        }
      }
    }
  }
}

PRIVATE get_new_bucket_dims(
  BUCKET_CONTEXT *nbc,
  int llx,
  int lly,
  int urx,
  int ury,
  int data_count)

{
  double w,k,r;
  int width;
  double xmax,ymax;

k = nbc->max_objects_in_bucket;
        r = nbc->l_to_w_ratio;

xmax = (urx - llx);
  ymax = (ury - lly);
  w = (xmax * ymax * k / (r * data_count)) * 2.0;
  w = sqrt(w);

width = w;

/*width = MAX2(width,DEFAULT_STRIPE_WIDTH);*/ nbc->smallest_stripe_width = width;

printf("\n Optimizing with width = %d" ,width);

}
/*
**          END
*/
```

What is claimed is:

1. Apparatus for graphically representing two-dimensional objects positioned in a flat area, comprising:
   a digital data storage unit; and
   a computer operationally connected to the storage unit and programmed to generate electrical representations of a first two-dimensional surface including multiple parallel stripes dividing the surface, each stripe including two or more sub-stripes of pre-determined sizes, each sub-stripe having associated therewith a group of lists, wherein each list contains a representation of all objects intersecting the sub-stripe associated with that list in a designated manner such that each object is only represented in a single list.

2. The apparatus of claim 1, wherein the stripes of the first two-dimensional surface are of uniform width, and wherein the storage unit additionally includes a second two-dimensional surface having stripes that differ in width from the stripes of the first two-dimensional surface.

3. The apparatus of claim 2, wherein the stripes of the second surface are orthogonal to the stripes of the first surface.

4. The apparatus of claim 3, wherein the stripes of the first and second surfaces are oriented in horizontal and vertical directions, respectively.

5. The apparatus of claim 4, wherein the storage unit additionally includes multiple surfaces having stripes oriented in horizontal directions, and multiple surfaces having stripes oriented in vertical directions.

6. The apparatus of claim 1, wherein each group of lists comprises:
   a first list containing a representation of each object having a left edge and a bottom edge that intersects the sub-stripe associated with said first list;
   a second list containing a representation of all objects having only a bottom edge that intersects the sub-stripe associated with said second list;
   a third list containing a representation of all objects having only a left edge that intersects the sub-stripe associated with said third list; and
   a fourth list containing a representation of all objects not represented in the first, second, or third lists, in the event said objects intersect the sub-stripe associated with said fourth list.

7. A method of graphically modeling objects in a flat area, comprising the steps of:
   storing in a computer memory electrical representations of a two-dimensional surface including a plurality of uniform parallel stripes dividing the surface, wherein each stripe includes two or more sub-stripes, each sub-stripe having associated therewith a first, second, third, and fourth list;
   for each sub-stripe, performing steps comprising:
   (1) storing in the first list associated with that sub-stripe representations of all rectangular objects having edges in first and second adjacent positions that intersect the sub-stripe;
   (2) storing in the second list associated with that sub-stripe representations of all rectangular objects having only an edge in the second position that intersects the sub-stripe;
   (3) storing in the third list associated with that sub-stripe representations of all objects having only an edge in the first position that intersects the sub-stripe;
   (4) storing in the fourth list representations of all objects intersecting the sub-stripe that are not represented in the first, second, or third lists.

8. The method of claim 7, wherein the object's height is less than twice the height of the stripes.

9. The method of claim 7, further including a method of querying graphically modeled objects, comprising the steps of:
   receiving boundaries of a region in the two-dimensional surface for which the query is desired;
   reporting all objects represented in the first, second, third, or fourth lists of the sub-stripe that intersects the bottom-left corner of the region, in the event said objects intersect the region;
   reporting all objects represented in the first or second lists of any sub-stripes intersecting the left edge, but not the bottom edge, of the region, in the event said objects intersect the region;
   reporting all objects represented in the first or third lists of any sub-stripes intersecting the bottom edge, but not the left edge, of the region, in the even said objects intersect the region;
   reporting all objects represented in first list of any sub-stripes intersecting the top or right edges of the region, in the even said objects intersect the region; and
   reporting all objects represented in the first list of any sub-stripes intersecting the region but not intersecting any edge of the region.

10. The method of claim 7, further including a routine for deleting graphically modeled objects, comprising the steps of:
    selecting an object to be deleted;
    determining which sub-stripes are intersecting by the object; and
    deleting representations of the object contained in the lists of each sub-stripe intersecting by the object.

11. The method of claim 7, further including a routine for deleting graphically modeled objects, comprising the steps of:
    selecting an object to be deleted;
    selecting a surface having stripes of the smallest height possible such that the heights of said stripes are still greater than a predetermined portion of the object's height;
    determining which sub-stripes of said selected surface are intersected by the object; and
    deleting representations of the object contained in the lists of each sub-stripe intersected by the object.

12. The method of claim 7 further including a routine for deleting graphically modeled objects, comprising the steps of:
    selecting an object to be deleted;
    determining which sub-stripes are intersected by the object; and
    deleting representations of the object contained in the lists of each sub-stripe intersected by the object, by performing steps comprising:
    (1) deleting representations of the object contained in all first lists of sub-stripes intersecting preselected first and second adjacent edges of the object;
    (2) deleting representations of the object contained in all second lists of sub-stripes intersecting only the object's second edge;
    (3) deleting representations of the object contained in all third lists of sub-stripes intersecting only the object's first edge; and (4) deleting representations of the object contained in all fourth lists of sub-stripes intersecting the object but intersecting neither the first edge nor the second edge of the object.

13. The method of claim 12, wherein the first edge comprises the object's left edge, and the second edge comprises the object's bottom edge.

14. The method of claim 12, wherein the first edge comprises the object's bottom edge, and the second edge comprises the object's right edge.

15. The method of claim 12, wherein the first edge comprises the object's right edge, and the second edge comprises the object's top edge.

16. The method of claim 12, wherein the first edge comprises the object's top edge, and the second edge comprises the object's left edge.

17. The method of claim 7, further including a routine for querying graphically modeled objects located in a selected region of the flat area, comprising the steps of:
identifying all sub-stripes in the region; and
reporting all objects that intersect each identified sub-stripe according to the lists corresponding to that sub-stripe.

18. A method of graphically modeling an object in a flat area, comprising the steps of:
initially classifying the object as being larger in the horizontal direction or larger in the vertical direction;
storing in a computer memory electrical representations of:
(1) a first set of two-dimensional surfaces, wherein each surface includes a plurality of parallel horizontal stripes of uniform height dividing the surface, wherein the height of the stripes of each surface differs from the stripes of the other surfaces, and wherein each stripe includes two or more sub-stripes arranged end-to-end and each sub-stripe has associated therewith one or more lists; and
(2) a second set of two-dimensional surfaces, wherein each surface includes a plurality of parallel vertical stripes of uniform width dividing the surface, wherein the width of the stripes of each surface differs from the stripes of the other surfaces, and wherein each stripe includes two or more sub-stripes arranged end-to-end and each sub-stripe has associated therewith one or more lists;
in the event the object is larger in the horizontal direction, identifying the smallest stripe of the first set of surfaces that contains the object and identifying the sub-stripes of that surface that contain the object;
in the event the object is larger in the vertical direction, identifying the smallest stripe of the second set of surfaces that contains the object and identifying the sub-stripes of that surface that contain the object; and
storing one or more electrical representations of the object in the lists associated with the identified sub-stripes.

19. The method of claim 18, further including a routine for deleting graphically modeled objects, comprising the steps of:
selecting an object to be deleted;
in the event the object is larger in the horizontal direction, selecting the horizontal surface;
in the event the object is larger in the vertical direction, selecting the vertical surface;
determining which sub-stripes of said selected surface are intersected by the object; and
deleting representations of the object contained in the lists of each sub-stripe intersected by the object.

20. The method of claim 18, further comprising a routine for deleting graphically modeled objects comprising the steps of:
selecting an object to be deleted;
in the event the object is larger in the horizontal direction, selecting a surface having stripes of the smallest vertical dimension possible such that the vertical dimension of said stripes is still greater than a predetermined portion of the object's vertical dimension;
in the event the object is larger in the vertical direction, selecting a surface having stripes of the smallest horizontal dimension possible such that the horizontal dimension of said stripes is still greater than a predetermined portion of the object's horizontal dimension;
determining which sub-stripes of said selected surface are intersected by the object; and
deleting representations of the object contained in the lists of each sub-stripe intersected by the object.

21. The method of claim 18, further including a routine for deleting graphically modeled objects, comprising the steps of:
selecting an object to be deleted;
determining which sub-stripes are intersected by the object; and
deleting representations of the object contained in the lists of each sub-stripe intersected by the object.

22. The method of claim 18, further including a routine for deleting graphically modeled objects, comprising the steps of:
selecting an object to be deleted;
selecting a surface having stripes of the smallest height possible such that the heights of said stripes are still greater than a predetermined portion of the object's height;
determining which sub-stripes of said selected surface are intersected by the object; and
deleting representations of the object contained in the lists of each sub-stripe intersected by the object.

23. The method of claim 18, further including a routine for querying graphically modeled objects located in a selected region of the flat area, comprising the steps of:
identifying all sub-stripes in the region; and
reporting all objects that intersect each identified sub-stripe according to the lists corresponding to that sub-stripe.

24. Apparatus for representing two-dimensional objects positioned in a flat area, comprising a semiconductor memory containing electrical representations of the following:
a first two-dimensional surface corresponding to the flat area, including multiple parallel graphical stripes of equal width extending in one orthogonal direction across the surface, each graphical stripe being subdivided into graphical sub-stripes of predetermined sizes to form a graphical grid of rectangles; and
for each sub-stripe, a group of four lists operatively associated with the sub-stripe, wherein each list stores data representative of any objects intersecting that sub-stripe in a designated manner such that each object is represented only in a single list.

25. The structure of claim 24, wherein the graphical images are rectangular boxes which minimally bound their respective objects.

26. The structure of claim 25, wherein:
a first said list of any given said sub-stripe identifies boxes of which two selected adjacent edges intersect the said sub-stripes;
a second said list of the given said sub-stripe identifies boxes of which only one of said selected edges intersects the said sub-stripe;
a third said list of the given said sub-stripe identifies boxes of which only the other of said selected edges intersects the said sub-stripe; and
a fourth said list of the given said sub-stripe identifies boxes intersecting said sub-stripe wherein neither of said selected edges of the box intersects the said sub-stripe.

27. Apparatus for graphically modeling an integrated circuit or other assembly of two-dimensional area, said apparatus comprising:
a digital data storage unit including lists for storing data;
a visual display unit;
a computer functionally interconnecting the storage unit and the display unit and programmed to perform the following steps:

1) display the two-dimensional area;
2) generate a two-dimensional surface graphically representing the two-dimensional area;
3) generate a rectangular minimum bounding box for each object;
4) generate a two-dimensional graphical grid of rectangular sub-stripes on the surface;
5) position each box on the grid to correspond to the position of its respective object on the two-dimensional area;
6) for each object, record a signal in a first of a group of four lists associated with a sub-stripe that intersects two adjoining edges of the box for that object;
7) for each object, record a signal in each second of a group of four lists associated with each sub-stripe that intersects only one of the two adjoining edges of the box for that object;
8) for each object, record a signal in each third of a group of four lists associated with each sub-stripe that intersects the other of the two adjoining edges of the box for that object;
9) for each object, record a signal in each fourth of a group of four lists associated with each sub-stripe that intersects the box for that object if neither of the adjoining edges of the box intersects that sub-stripe.

* * * * *

UNITED STATES PATENT AND TRADEMARK OFFICE
CERTIFICATE OF CORRECTION

PATENT NO. : 5,319,743
DATED : June 7, 1994
INVENTOR(S) : Shiraj R. Dutta, et. al.

It is certified that error appears in the above-indentified patent and that said Letters Patent is hereby corrected as shown below:

Column 105, line 21, after "of", insert --objects on a --.

Signed and Sealed this

Thirtieth Day of August, 1994

*Attest:*

*Attesting Officer*

BRUCE LEHMAN

*Commissioner of Patents and Trademarks*